(12) United States Patent
Shin et al.

(10) Patent No.: US 10,109,704 B2
(45) Date of Patent: Oct. 23, 2018

(54) DISPLAY DEVICE AND MANUFACTURING METHOD THEREOF THAT MAY MINIMIZE AN OCCURRENCE OF A DEFECT IN THE DISPLAY DEVICE

(71) Applicant: SAMSUNG DISPLAY CO., LTD., Yongin-si, Gyeonggi-Do (KR)

(72) Inventors: Hyejin Shin, Yongin-si (KR); Wonkyu Kwak, Yongin-si (KR); Kwangmin Kim, Yongin-si (KR); Dongsoo Kim, Yongin-si (KR); Changkyu Jin, Yongin-si (KR)

(73) Assignee: SAMSUNG DISPLAY CO., LTD., Yongin-si, Gyeonggi-Do (KR)

( * ) Notice: Subject to any disclaimer, the term of this patent is extended or adjusted under 35 U.S.C. 154(b) by 51 days.

(21) Appl. No.: 15/297,640

(22) Filed: Oct. 19, 2016

(65) Prior Publication Data
US 2017/0288007 A1  Oct. 5, 2017

(30) Foreign Application Priority Data
Mar. 31, 2016 (KR) ........................ 10-2016-0039335

(51) Int. Cl.
| | |
|---|---|
| H01L 27/32 | (2006.01) |
| H01L 51/00 | (2006.01) |
| H01L 51/56 | (2006.01) |
| H01L 51/52 | (2006.01) |
| H01L 27/12 | (2006.01) |

(52) U.S. Cl.
CPC ...... *H01L 27/3279* (2013.01); *H01L 27/3258* (2013.01); *H01L 27/3262* (2013.01); *H01L 51/0097* (2013.01); *H01L 51/5253* (2013.01); *H01L 51/56* (2013.01); *H01L 27/124* (2013.01); *H01L 2227/323* (2013.01)

(58) Field of Classification Search
None
See application file for complete search history.

(56) References Cited

U.S. PATENT DOCUMENTS

| | | | | |
|---|---|---|---|---|
| 9,647,125 | B2 * | 5/2017 | Yamazaki | ........... H01L 29/7869 |
| 9,779,652 | B2 * | 10/2017 | Kajiyama | ................ G09G 3/30 |
| 2002/0024096 | A1 * | 2/2002 | Yamazaki | ........... H01L 27/1214 257/359 |
| 2003/0209726 | A1 * | 11/2003 | Shigeno | ............ G02F 1/133555 257/200 |

(Continued)

*Primary Examiner* — Lex Malsawma
(74) *Attorney, Agent, or Firm* — F. Chau & Associates, LLC

(57) ABSTRACT

A display device includes a substrate divided into an encapsulation area and a non-encapsulation area. The display device includes an interlayer insulating layer disposed over the substrate. The display device includes a first inner contact hole passing through the interlayer insulating layer in the encapsulation area, and connecting an inner conductive layer to an inner lower conductive layer. The display device includes an outer contact hole passing through the interlayer insulating layer in the non-encapsulation area, and connecting an outer conductive layer to an outer lower conductive layer. A slope angle formed by a lateral wall of the outer contact hole with respect to an upper surface of the substrate is less than a slope angle formed by a lateral wall of the first inner contact hole with respect to the upper surface of the substrate.

32 Claims, 21 Drawing Sheets

(56) References Cited

U.S. PATENT DOCUMENTS

| | | | |
|---|---|---|---|
| 2009/0242885 A1* | 10/2009 | Takamatsu | G02F 1/1345 257/59 |
| 2011/0007042 A1* | 1/2011 | Miyaguchi | G02F 1/133305 345/204 |
| 2013/0285054 A1* | 10/2013 | Moriguchi | H01L 27/1225 257/43 |
| 2014/0167006 A1* | 6/2014 | Kim | H01L 27/3244 257/40 |
| 2015/0048361 A1 | 2/2015 | Yamakita et al. | |
| 2015/0171151 A1* | 6/2015 | Chae | H01L 27/3262 257/40 |
| 2015/0255740 A1* | 9/2015 | Nakada | H01L 51/0097 257/40 |

\* cited by examiner

DISPLAY DEVICE AND MANUFACTURING METHOD THEREOF THAT MAY MINIMIZE AN OCCURRENCE OF A DEFECT IN THE DISPLAY DEVICE

CROSS-REFERENCE TO RELATED APPLICATION

This application claims priority under 35 USC § 119 to Korean Patent Application No. 10-2016-0039335, filed on Mar. 31, 2016 in the Korean Intellectual Property Office, the disclosure of which is incorporated by reference herein in its entirety.

TECHNICAL FIELD

Exemplary embodiments of the present inventive concept relate to a display device and a manufacturing method thereof, and more particularly, to a display device and a manufacturing method thereof that may minimize an occurrence of a defect in the display device.

DISCUSSION OF THE RELATED ART

Display devices are widely used to visually display data. Typically, the display device includes a substrate divided into a display area and a non-display area. The display area includes gate lines and data lines that are mutually insulated. In addition, the gate lines cross the data lines and define a plurality of pixel regions in the display area. The display area further includes a thin film transistor (TFT), and a pixel electrode electrically connected to the TFT and is provided in each of the pixel regions. The non-display area may include various conductive layers such as a wiring transferring an electric signal to the display area. Meanwhile, the display area is sealed by an encapsulation substrate or an encapsulation layer.

SUMMARY

According to an exemplary embodiment of the present inventive concept, a display device includes a substrate divided into an encapsulation area and a non-encapsulation area. The display device further includes an interlayer insulating layer disposed over the substrate, and an inner conductive layer disposed over the interlayer insulating layer in the encapsulation area. The display device additionally includes an outer conductive layer disposed on the interlayer insulating layer in the non-encapsulation area, and an inner lower conductive layer disposed below the interlayer insulating layer in the encapsulation area. The display device further includes an outer lower conductive layer disposed below the interlayer insulating layer in the non-encapsulation area. The display device additionally includes a first inner contact hole passing through the interlayer insulating layer and connecting the inner conductive layer to the inner lower conductive layer. The display device further includes an outer contact hole passing through the interlayer insulating layer and connecting the outer conductive layer to the outer lower conductive layer. A slope angle formed by a lateral wall of the outer contact hole with respect to an upper surface of the substrate is less than a slope angle formed by a lateral wall of the first inner contact hole with respect to the upper surface of the substrate.

In an exemplary embodiment of the present inventive concept, the display device further includes a semiconductor layer disposed over the substrate. The display device additionally includes a gate insulating layer disposed between the semiconductor layer and the interlayer insulating layer. The display device further includes a second inner contact hole passing through the interlayer insulating layer and the gate insulating layer and connecting the inner conductive layer to the semiconductor layer. The slope angle formed by the lateral wall of the outer contact hole with respect to the upper surface of the substrate being less than a slope angle formed by a lateral wall of the second inner contact hole with respect to the upper surface of the substrate.

In an exemplary embodiment of the present inventive concept, the slope angle formed by the lateral wall of the first inner contact hole with respect to the upper surface of the substrate is substantially the same as the slope angle formed by the lateral wall of the second inner contact hole with respect to the upper surface of the substrate.

In an exemplary embodiment of the present inventive concept, an area of the outer contact hole is greater than an area of the first inner contact hole.

In an exemplary embodiment of the present inventive concept, the slope angle formed by the lateral wall of the outer contact hole with respect to the upper surface of the substrate ranges from about 10° to about 60°.

In an exemplary embodiment of the present inventive concept, the outer conductive layer comprises substantially the same material as that of the inner conductive layer.

In an exemplary embodiment of the present inventive concept, a plurality of outer contact holes are adjacent to one another.

In an exemplary embodiment of the present inventive concept, the display device further includes an inorganic insulating layer comprising a groove in the non-encapsulation area, and an organic layer filling at least a portion of the opening or the groove. The display device further includes the substrate including a bending area located between a first region and a second region and being bent around a bending axis extending in a first direction, and the groove overlapping the bending area.

In an exemplary embodiment of the present inventive concept, the outer conductive layer extends from the first region to the second region by way of the bending area and is disposed on the organic layer.

In an exemplary embodiment of the present inventive concept, the groove has an area greater than an area of the bending area.

In an exemplary embodiment of the present inventive concept, the groove has an area greater than the area of the outer contact hole.

In an exemplary embodiment of the present inventive concept, the organic layer covers an inner lateral surface of the groove.

In an exemplary embodiment of the present inventive concept, a height from the upper surface of the substrate to at least a portion of the organic layer is greater than a height from the upper surface of the substrate to the inorganic insulating layer.

In an exemplary embodiment of the present inventive concept, the organic layer comprises an irregular surface in at least a portion of an upper surface thereof.

In an exemplary embodiment of the present inventive concept, the display device further includes a stress neutralization layer disposed over the outer conductive layer in the bending area.

In an exemplary embodiment of the present inventive concept, the display device further includes a protective film disposed on a surface of the substrate opposite to another surface of the substrate on which the inorganic insulating layer is disposed and comprising an opening corresponding to the bending area.

In an exemplary embodiment of the present inventive concept, the encapsulation area includes an encapsulation layer comprising a first inorganic encapsulation layer, a second inorganic encapsulation layer, and an organic encapsulation layer disposed between the first and second inorganic encapsulation layers.

In an exemplary embodiment of the present inventive concept, the encapsulation area includes an encapsulation substrate facing the substrate and a sealing member surrounding the display area, and the substrate and the encapsulation substrate are attached to one another by the sealing member.

In an exemplary embodiment of the present inventive concept, the display device further includes a touch electrode for a touchscreen located over the encapsulation area. The touch electrode comprises a material substantially the same as that of the outer conductive layer.

In an exemplary embodiment of the present inventive concept, the display device further includes a touch protective layer covering the touch electrode and the outer conductive layer.

In an exemplary embodiment of the present inventive concept, the display device further includes a thin film transistor disposed in the display area and comprising a source electrode, a drain electrode, and a gate electrode. The outer conductive layer and the inner conductive layer being disposed on a same layer as a layer in which the source electrode and the drain electrode are disposed, and the outer lower conductive layer and the inner lower conductive layer being disposed on a same layer as a layer in which the gate electrode is disposed.

In an exemplary embodiment of the present inventive concept, an organic light-emitting diode is disposed in the display area and comprises a pixel electrode, an opposite electrode facing the pixel electrode, and an intermediate layer comprising an organic emission layer disposed between the pixel electrode and the opposite electrode.

In an exemplary embodiment of the present inventive concept, a mask pattern to form the display device includes an inner contact hole mask pattern for forming the inner contact hole of the display device. The mask pattern further includes an outer contact hole pattern for forming the outer contact hole of the display device having a shape different from a shape of an inner contact hole pattern.

In an exemplary embodiment of the present inventive concept, the outer contact hole pattern further comprises a central portion, a circumferential portion surrounding the central portion, and a spaced portion disposed between the central portion and the circumferential portion, and the central portion and the circumferential portion have same properties with respect to light, and the central portion and the spaced portion have opposite properties with respect to light.

In an exemplary embodiment of the present inventive concept, the circumferential portion has a shape substantially the same as a polygonal shape or a circular ring shape, and an irregular pattern is disposed along an outer parameter of the circumferential portion.

In an exemplary embodiment of the present inventive concept, the outer contact hole pattern comprises a central portion and a circumferential portion surrounding the central portion. The circumferential portion includes a semi-transmission portion.

In an exemplary embodiment of the present inventive concept, the outer contact hole is simultaneously formed with the first inner contact hole.

In an exemplary embodiment of the present inventive concept, the outer contact hole pattern has an area greater than an area of the inner contact hole pattern.

In an exemplary embodiment of the present inventive concept, the mask pattern further includes an inorganic insulating layer comprising a groove in the non-encapsulation area. The groove is simultaneously formed with the outer contact hole.

In an exemplary embodiment of the present inventive concept, the display device includes a bending area bent around a bending axis, and the groove overlaps the bending area.

According to an exemplary embodiment of the present inventive concept, a display device includes a flexible substrate divided into a first area, and a second area. The second area includes a bending area. The display device further includes an inorganic insulating layer disposed over the substrate. The inorganic insulating layer includes a buffer layer, a gate insulating layer, an interlayer insulating layer, and a groove in the second area. The groove overlaps the bending area. The display device further includes an inner conductive layer disposed in the first area, an inner lower conductive layer disposed in the first area, and an outer conductive layer disposed in the second area. The display device additionally includes an outer lower conductive layer disposed below the outer conductive layer in the second area. The display device further includes an inner contact hole passing through the interlayer insulating layer and connecting the inner conductive layer to the inner lower conductive layer. The display device additionally includes at least one outer contact hole passing through the interlayer insulating layer and connecting the outer conductive layer to the outer lower conductive layer. An area of the at least one outer contact hole is greater than an area of the inner contact hole.

In an exemplary embodiment of the present inventive concept, the display device further includes a planarization layer disposed on the outer conductive layer and inner conductive layer and including an opening outside of the first area. The display device additionally includes a stress neutralization layer disposed on the planarization layer.

In an exemplary embodiment of the present inventive concept, an angle of slope of a lateral wall of the at least one outer contact hole with respect to an upper surface of the substrate is less than an angle of slope of a lateral wall of the inner contact hole with respect to the upper surface of the substrate.

In an exemplary embodiment of the present inventive concept, an outer contact hole is adjacent to a second outer contact hole and the distance between centers of adjacent outer contact holes is within a range of two times a width of the outer contact hole.

In an exemplary embodiment of the present inventive concept, the display device further includes a protective film overlapping the flexible substrate except the bending area.

BRIEF DESCRIPTION OF THE DRAWINGS

Exemplary embodiments of the present inventive concept will be more clearly understood by describing in detail exemplary embodiments thereof with reference to the accompanying drawings.

DETAILED DESCRIPTION

Figure 1:
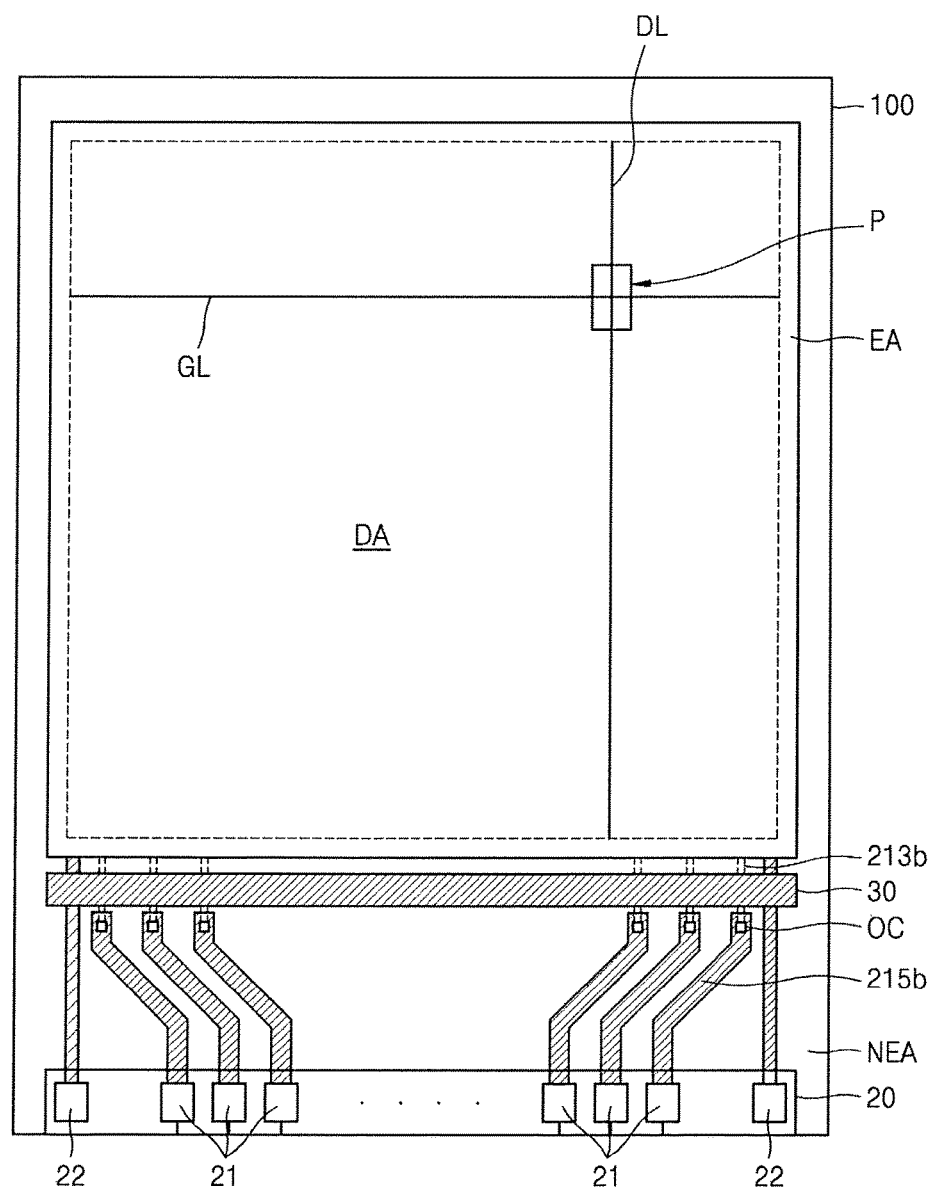
FIG. 1 is a plan view of a portion of a display device according to an exemplary embodiment of the present inventive concept.

Hereinafter, the present inventive concept will be described more fully with reference to the accompanying drawings, in which exemplary embodiments of the present inventive concept are shown. When description is made with reference to the drawings, like reference numerals in the drawings that denote like or corresponding elements and repeated description thereof will be omitted.

In the following exemplary embodiments of the present inventive concept, the x-axis, the y-axis and the z-axis are not limited to three axes of the Cartesian coordinate system, and may be interpreted in a broader sense. For example, the x-axis, the y-axis, and the z-axis may be perpendicular to one another, or may represent different directions that are not perpendicular to one another.

A display device is a device displaying an image and may include a liquid crystal display (LCD), an electrophoretic display, an organic light-emitting display, an inorganic light-emitting display, a field emission display, a surface-conduction electron-emitter display, a plasma display, a cathode ray display, etc.

Hereinafter, though an organic light-emitting display device is exemplarily described as a display device according to an exemplary embodiment of the present inventive concept, the display device according to an exemplary embodiment of the present inventive concept is not limited thereto and various types of display device may be used.

Figure 2:
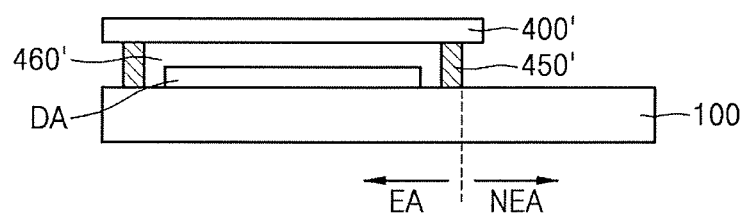
FIG. 2 is a cross-sectional view of a portion of the display device of FIG. 1.
Figure 3:
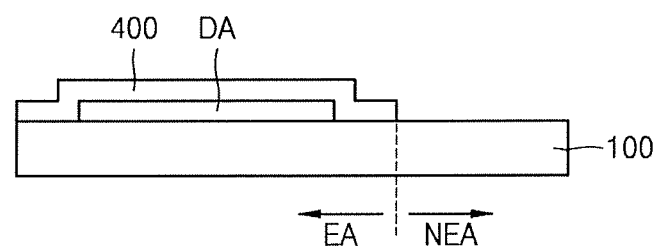
FIG. 3 is a cross-sectional view of a portion of a display device according to an exemplary embodiment of the present inventive concept.

FIG. 1 is a plan view of a portion of a display device according to an exemplary embodiment of the present inventive concept. FIG. 2 is a cross-sectional view of an example of encapsulating an encapsulation area EA of FIG. 1 by using an encapsulation substrate 400' according to an exemplary embodiment of the present inventive concept. FIG. 3 is a cross-sectional view of an example of encapsulating the encapsulation area EA of FIG. 1 by using an encapsulation layer 400 according to an exemplary embodiment of the present inventive concept.

Referring to FIGS. 1 to 3, a display device according to an exemplary embodiment of the present inventive concept may include a substrate 100 divided into an encapsulation area EA encapsulating a display area DA and a non-encapsulation area NEA. The non-encapsulation area may include an outer conductive layer 215b arranged in the non-encapsulation area NEA. The display device may further include a plurality of pads 21 connected to the outer conductive layer 215b. The plurality of pads 21 may form a pad portion 20.

In addition, the non-encapsulation area NEA surrounds the encapsulation area EA. The encapsulation area EA may include an encapsulation member such as the encapsulation substrate 400' or the encapsulation layer 400 to overlap an area of the display area.

Further, a plurality of pixels P may be disposed in the display area DA of the substrate 100 and may display an image. In addition, the display area DA may include various elements, such as a thin film transistor (TFT), an organic light-emitting diode (OLED), and a capacitor may be provided to the display area DA.

The display area DA may include signal lines such as a gate line GL transferring a gate signal and a data line DL transferring a data signal, a driving power line transferring power, and a common power line. A pixel P may be formed by electric coupling of a TFT, a capacitor, an OLED, etc. The pixel P may be connected to the gate line GL and the data line DL, and the driving power line and may emit light to display an image. The pixel P may emit light at a brightness corresponding to a driving current flowing through the OLED in response to a data signal based on a supplied driving power and common power to the pixel P. The signal lines may be connected to a driver integrated circuit (IC) connected to a pad portion 20 via wirings of the outer conductive layer 215b. The display area DA may include a plurality of pixels that may be arranged in various forms such as a stripe arrangement and a pantile arrangement. The display device may further include an encapsulation member encapsulating the display area DA from an external environment. For example, the encapsulation member may encapsulate the entire display area DA.

Referring to FIG. 2, the display area DA of the display device may be encapsulated in the encapsulation area EA by the encapsulation substrate 400'. For example, the encapsulation substrates 400' may overlap the display area DA. In the case where the display area DA is encapsulated by the encapsulation substrate 400', the substrate 100 and the encapsulation substrate 400' may be attached to one another by a sealing member 450'. The sealing member 450' may surround the periphery of the display area DA.

In this case, the substrate 100 and the encapsulation substrate 400' may include a transparent material including silicon dioxide ($SiO_2$) as a primary component. However, the material of the substrate 100 and the encapsulation substrate 400' is not limited thereto. For example, a substrate including various compounds and materials such as ceramic and a transparent plastic material may be used.

The sealing member 450' may include an inorganic material and, for example, frit. However, the sealing member 450' is not limited thereto. For example, the sealing member 450' may include epoxy. The sealing member 450' may be formed by a coating using a dispenser or a screen printing method. In addition, frit generally denotes a glass raw material in a powder form, but the frit according to an exemplary embodiment of the present inventive concept may include frit in a paste state. The frit in the paste state may include, for example, a laser or infrared absorbing agent, an organic binder, a filler for reducing thermal expansion coefficient, etc. Further, primary material such as $SiO_2$ may include the frit such as, for example, frit in a paste state. The frit in a paste state may be hardened by removing an organic binder and moisture via a drying or plastic process. The laser or infrared absorbing agent may include a transition metal compound. A laser light may be used as to attach the substrate 100 to the encapsulation substrate 400', by hardening the sealing member 450'.

The encapsulation area EA may include an inner filling member 460' disposed between the substrate 100, the encapsulation substrate 400', the sealing member 450', and the display area DA. The inner filling member 460' may protect various devices disposed on the display area DA against an external force that may be applied. In an exemplary embodiment of the present inventive concept, the inner filling member 460' may include a urethane-based resin, an epoxy-based resin, an acryl-based resin, which are organic sealants, or silicon, which is an inorganic sealant, etc. As a urethane-based resin, for example, urethane acrylate, etc. may be used. As an acryl-based resin, for example, butyl acrylate, ethylhexyl acrylate, etc. may be used.

Referring to FIG. 3, the display area DA of the display device may be encapsulated by using the encapsulation layer 400. The encapsulation layer 400 may be disposed on the display area DA and the substrate 100. The encapsulation layer 400 may surround the upper surface and lateral surface of the display area DA and extend up to the outer portion of the display area DA. The encapsulation layer 400 may partially cover the substrate 100. In an exemplary embodiment according to the present inventive concept, the encapsulation layer 400 may not cover the entire substrate 100 (e.g., the non-encapsulation area NEA).

The encapsulation layer 400 may include a multi-layered structure. For example, the encapsulation layer 400 may include a plurality of inorganic layers, or include at least one inorganic layer and at least one organic layer stacked therein. In an exemplary embodiment according to the present inventive concept, the encapsulation layer 400 may include a layer structure including a low melting glass such as tin(II) oxide (SnO).

In this case, the substrate 100 may include various materials such as glass, metal, or plastic. According to an exemplary embodiment according to the present inventive concept, the substrate 100 may include a flexible material. Here, the flexible material may be bent, warped, folded, or rolled. Further, the substrate 100 may include various materials having a flexible or bendable characteristic. For example, the substrate 100 may include a polymer resin such as polyethersulphone (PES), polyacrylate (PAR), polyetherimide (PEI), polyethylenen naphthalate (PEN), polyethyleneterepthalate (PET), polyphenylene sulfide (PPS), polyallylate, polyimide (PI), polycarbonate (PC) or cellulose acetate propionate (CAP).

The encapsulation substrate 400' or the encapsulation layer 400 described with reference to FIGS. 2 and 3, respectively, may block external elements of the environment such as air or moisture, etc. from penetrating into the display area DA.

Referring to FIG. 1 again, the non-encapsulation area NEA may include the outer conductive layer 215b. The outer conducive layer 215b may denote a conductive layer disposed in the non-encapsulation area NEA and may be a conductive layer included in an electric device such as a wiring or a TFT arranged in the non-encapsulation area NEA. For example, the outer conductive layer 215b may be a wiring transferring a data signal, a gate signal, etc. from a driver IC disposed on the pad portion 20.

In this case, the outer conductive layer 215b may have a structure connected to an outer lower conductive layer 213b disposed in a different layer via an outer contact hole OC. A driving power line 30 may be disposed in the same layer as a layer where the outer conductive layer 215b is disposed. For example, the outer contact hole OC may be disposed in a layer below the driving power line 30. Further, the driving power line 30 may be disposed in the non-encapsulation area NEA. The driving power line 30 may be connected to the driver IC via a driving terminal 22 and may provide a driving voltage ELVDD provided from the driver IC to the pixels P disposed in the display area DA. The driving power line 30 may cover one lateral surface of the display area DA. In this case, signal lines supplying a data signal or a gate signal to the display area DA cross the driving power line 30. Connecting the outer conductive layer 215b to the outer lower conductive layer 213b via the outer contact hole OC may be for avoiding collision in a cross region with the driving power line 30.

Figure 4:
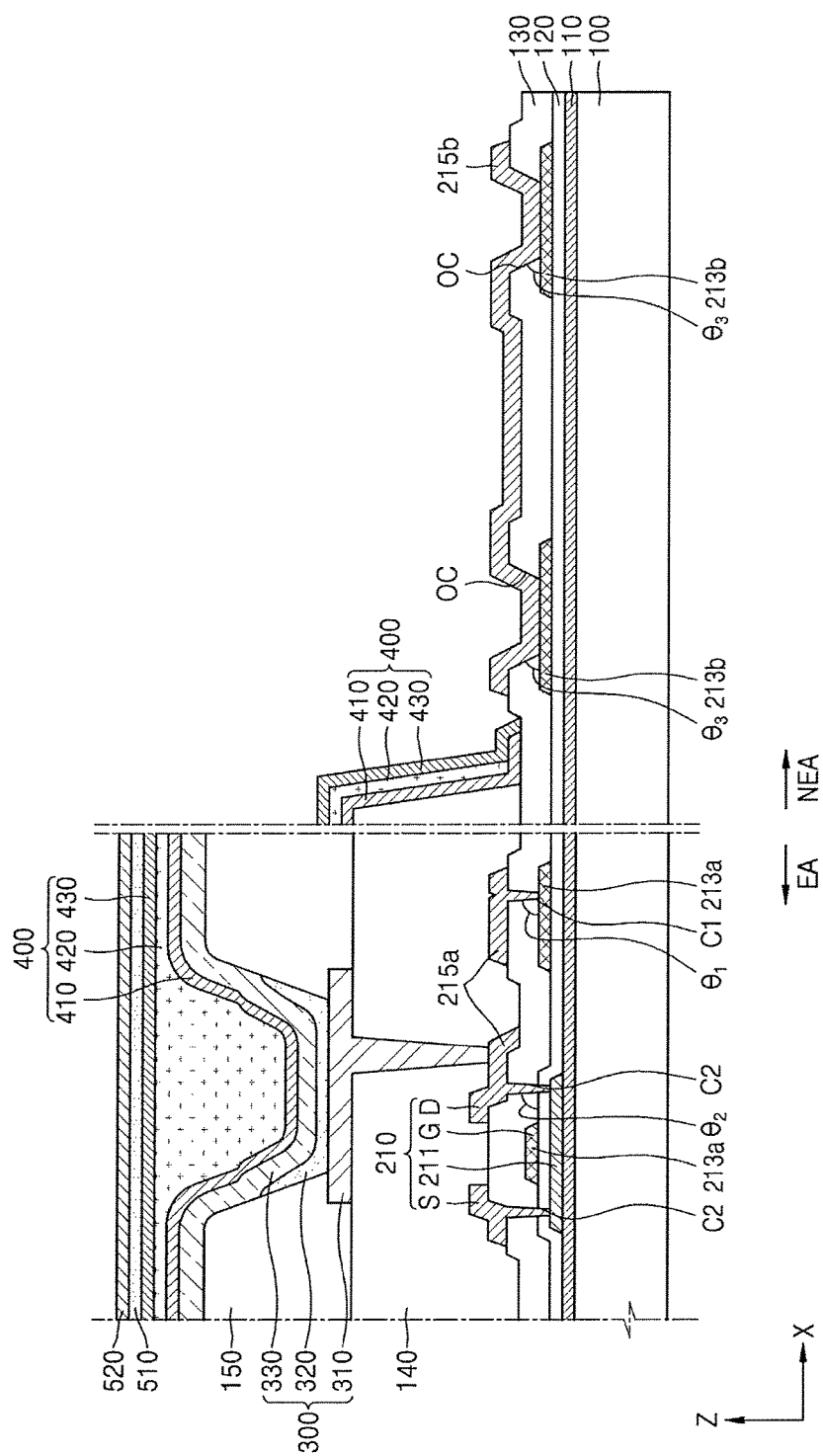
FIG. 4 is a cross-sectional view of a portion of a display device according to an exemplary embodiment of the present inventive concept.

A display device according to an exemplary embodiment of the present inventive concept is described below with reference to FIG. 4. FIG. 4 illustrates that the encapsulation layer 400 is used as an encapsulation member.

A plurality of pixels may be disposed in the display area DA of the substrate 100 and may emit light to display an image. Devices such as a display element 300, a TFT 210, and a capacitor may be disposed in the display area DA. FIG. 4 illustrates that an OLED is disposed in the display area as the display element 300. For example, the OLED may be electrically connected to the TFT 210, and a pixel electrode 310 may be electrically connected to the TFT 210. As understood by a person of ordinary skill in the art, a TFT may also be disposed in a circumferential region disposed outside the display area DA of the substrate 100. The TFT disposed in the circumferential region may be a portion of a circuit for controlling an electric signal applied into the display area DA, for example.

The TFT 210 may include a semiconductor layer 211, a gate electrode G, a source electrode S, and a drain electrode D. The TFT 210 may further include, for example, amorphous silicon, polycrystalline silicon, an oxide semiconductor or an organic semiconductor material.

The gate electrode G may be connected to a gate line applying an on/off signal to the TFT 210 and may include a low resistance metallic material. For example, the gate electrode G may include a single layer or a multi-layer including a conductive material including molybdenum (Mo), aluminum (Al), copper (Cu) and/or titanium (Ti), etc.

The source electrode S and the drain electrode D may include a single layer or a multi-layer including a conductive material (e.g., a material with excellent conductivity) and may be respectively connected to a source region and a drain region of the semiconductor layer 211. For example, the source electrode S and the drain electrode D may include a single layer or a multi-layer including a conductive material including Al, Cu and/or Ti, etc.

The source electrode S and the drain electrode D may be connected to the semiconductor layer 211 via a second inner contact hole C2. The second inner contact hole C2 may pass through an interlayer insulating layer 130 and a gate insulating layer 120. The interlayer insulating layer 130 and the gate insulating layer 120 may be disposed above the semiconductor layer 211.

Even though the TFT 210 according to an exemplary embodiment of the present inventive concept may be a top gate-type TFT in which the gate electrode G is disposed over the semiconductor layer 211, the exemplary embodiment of the present inventive concept is not limited thereto. For example, a TFT 210 according to an exemplary embodiment of the present inventive concept may be a bottom gate-type TFT in which the gate electrode G is disposed below the semiconductor layer 211.

To insulate the semiconductor layer 211 from the gate electrode G, the gate insulating layer 120 including an inorganic material such as silicon oxide, silicon nitride, and/or silicon oxynitride may be disposed between the semiconductor layer 211 and the gate electrode G. Also, the interlayer insulating layer 130 including an inorganic material such as silicon oxide, silicon nitride, and/or silicon oxynitride may be disposed over the gate electrode G. The source electrode S and the drain electrode D may be disposed over the interlayer insulating layer 130. The insulating layer including an inorganic material (e.g., the interlayer insulating layer 130 and the gate insulating layer 120) may be formed by using chemical vapor deposition (CVD) or atomic layer deposition (ALD). The same may be applied to exemplary embodiments of the present inventive concept described below and modifications thereof.

A buffer layer 110 may be disposed between the TFT 210 having the above structure and the substrate 100. The buffer layer 110 may include an inorganic material such as silicon oxide, silicon nitride, and/or silicon oxynitride. The buffer layer 110 may increase the planarization of the upper surface of the substrate 100, or prevent or minimize penetration of impurities from the substrate 100, etc. into the semiconductor layer 211 of the TFT 210.

Also, a planarization layer 140 may be disposed over the TFT 210. For example, as illustrated in FIG. 4, in the case where an OLED is disposed over the TFT 210, the planarization layer 140 may generally planarize the upper portion of a protective layer covering the TFT 210. The planarization layer 140 may include an organic material such as acryl, benzocyclobutene (BCB), or hexamethyldisiloxane (HMDSO). Even though FIG. 4 illustrates that the planarization layer 140 is a single layer, the planarization layer 140 may be a multi-layer and may change variously.

In the display area DA of the substrate 100, an OLED including the pixel electrode 310, an opposite electrode 330, and an intermediate layer 320 disposed between the pixel electrode 310 and the opposite electrode 330. The intermediate layer 320 may include an emission layer. The emission layer may be disposed over the planarization layer 140. The pixel electrode 310 may be electrically connected to the TFT 210 by contacting one of the source electrode S and the drain electrode D via an opening formed in the planarization layer 140 as illustrated in FIG. 4.

A pixel-defining layer 150 may be disposed over the planarization layer 140. The pixel-defining layer 150 defines a pixel by including an opening corresponding to sub-pixels. For example, an opening exposing at least a central portion of the pixel electrode 310. Also, in a case illustrated in FIG. 2, the pixel-defining layer 150 prevents an arc, etc. from being formed at the edge of the pixel electrode 310 by increasing a distance between the edge of the pixel electrode 310 and the opposite electrode 330 disposed above the pixel electrode 310. The pixel-defining layer 150 may include an organic material such as polyimide (PI) or hexamethyldisiloxane (HMDSO).

The intermediate layer 320 of the OLED may include a material or polymer material with a low molecular weight. In the case where the intermediate layer 320 includes material with a low molecular weight, the intermediate layer 320 may have a structure in which a hole injection layer (HIL), a hole transport layer (HTL), an emission layer (EML), an electron transport layer (ETL), an electron injection layer (EIL), etc. may be stacked in a single or composite structure. The intermediate layer 320 may include various organic materials such as copper phthalocyanine (CuPc), N,N'-Di(naphthalene-1-yl)-N,N'-diphenyl-benzidine (NPB), and tris-8-hydroxyquinoline aluminum (Alq3). These layers may be formed by using a vacuum deposition method.

In an exemplary embodiment of the present inventive concept where the intermediate layer 320 includes a polymer material, the intermediate layer 320 may have a structure that includes an HTL and an EML. The HTL may include a poly 3,4-ethylenedioxythiophene (PEDOT). The EML may include a polymer material such as a poly-phenylenevinylene (PPV)-based material and a polyfluorene-based material. The intermediate layer 320 may be formed by using, for example, screen printing, an inkjet printing method, or laser induced thermal imaging (LITI), etc.

The intermediate layer 320 is not necessarily limited thereto. The intermediate layer 320 may have various structures. For example, the intermediate layer 320 may include a layer integrally disposed over a plurality of pixel electrodes 310 and may include a layer patterned to correspond to the plurality of pixel electrodes 310.

The opposite electrode 330 may be disposed over the display area DA and may cover the display area DA as illustrated in FIG. 4. For example, the opposite electrode 330 may be integrally disposed over a plurality of OLEDs and may correspond to the plurality of pixel electrodes 310. For example, the opposite electrode 330 may be aligned with the pixel electrode 310.

Since the OLED may be easily damaged by external elements of the environment, such as moisture or oxygen, etc., an encapsulation layer 400 may be disposed over the OLEDs to protect them. The encapsulation layer 400 may cover the display area DA and extend up to the outer side of the display area DA. As illustrated in FIG. 4 according to an exemplary embodiment of the present inventive concept, the encapsulation layer 400 may include a first inorganic encapsulation layer 410, an organic encapsulation layer 420, and a second inorganic encapsulation layer 430.

The first inorganic encapsulation layer 410 may be disposed on the opposite electrode to cover the opposite electrode 330. The first inorganic encapsulation layer 410 may include silicon oxide, silicon nitride, and/or silicon oxynitride. In addition, other layers such as a capping layer, etc. may be disposed between the first inorganic encapsulation layer 410 and the opposite electrode 330. In an exemplary embodiment of the present inventive concept, since the first inorganic encapsulation layer 410 is disposed along a structure below the first inorganic encapsulation layer 410, the upper surface of the first inorganic encapsulation layer 410 might not be planarized as illustrated in FIG. 4. The organic encapsulation layer 420 may be disposed on the first encapsulation layer 410 to cover the first inorganic encapsulation layer 410. Unlike the first inorganic encapsulation layer 410, the upper surface of the organic encapsulation layer 420 may be planarized. For example, the upper surface of the organic encapsulation layer 420 may be approximately planarized in a portion corresponding to the display area DA. The organic encapsulation layer 420 may include at least one of polyethyleneterepthalate (PET), polyethylenen napthalate (PEN), polycarbonate (PC), polyimide (PI), polyethylenesulphonate, polyoxymethylene (POM), polyacrylate (PAR), and hexamethyldisiloxane. The second inorganic encapsulation layer 430 may be disposed on organic encapsulation layer 420 to cover the organic encapsulation layer 420. The encapsulation layer 430 may include silicon oxide, silicon nitride, and/or silicon oxynitride. The second inorganic encapsulation layer 430 may prevent exposure of the organic encapsulation layer 420 to the external environment by contacting the first inorganic encapsulation layer 410 at the edge thereof located outside the display area DA.

Since the encapsulation layer 400 includes the first inorganic encapsulation layer 410, the organic encapsulation layer 420, and the second inorganic encapsulation layer 430, even when a crack occurs inside the encapsulation layer 400, a crack in the encapsulation layer 400 may not be allowed to be connected between the multiple layers of the encapsulation layer 400. For example, a crack in the encapsulation layer 400 may not be connected between the first inorganic encapsulation layer 410 and the organic encapsulation layer 420 or between the organic encapsulation layer 420 and the second inorganic encapsulation layer 430 via the above-described multi-layered structure. As a result, penetration of the elements of the external environment, such as moisture or oxygen, etc. into the display area DA may be prevented or minimized.

A polarization plate 520 may be disposed over the encapsulation layer 400 by using an optically clear adhesive (OCA) 510. The polarization plate 520 may reduce reflection of external light. For example, when external light passes through the polarization plate 520, and is reflected by the upper surface of the opposite electrode 330, and then passes through the polarization plate 520 again (e.g., the reflection), the phase of the external light may change since the external light passes through the polarization plate 520 two times. As a result, destructive interference may occur because the phase of the reflected light may be different from the phase of the external light entering the polarization plate 520. Thus, visibility may improve by reducing the reflection of the external light by, for example, the display elements 300. However, the display device according to an exemplary embodiment of the present inventive concept might not always include the polarization plate 520, and may omit the polarization plate 520 and replace the polarization plate 520 with another element. For example, the display device may omit the polarization plate 520 and may replace it with a black matrix and a color filter to reduce external light reflection.

The display device according to an embodiment of the present inventive concept includes an inner conductive layer 215a and the outer conductive layer 215b disposed on the interlayer insulating layer 130. The inner conductive layer 215a is disposed in the encapsulation area EA, and the outer conductive layer 215b is disposed in the non-encapsulation area NEA. The inner conductive layer 215a may be a conductive layer disposed on the interlayer insulating layer 130 in the encapsulation area EA and may be formed by patterning. The source electrode S and the drain electrode D of the TFT 210 may correspond to the inner conductive layer 215a. For example, the source S and drain D may be disposed on a same layer as a layer in which the inner conductive layer 215a is disposed. The outer conductive layer 215b may be a conductive layer disposed over the interlayer insulating layer 130 in the non-encapsulation area NEA and may be formed by patterning. A wiring transferring an electric signal to the display area DA may also correspond to the outer conductive layer 215b. For example, the wiring may be electrically connected to the display area DA. The inner conductive layer 215a and the outer conductive layer 215b may be a single layer or a multi-layer including a conductive material including Al, Cu, and/or Ti, etc.

An inner lower conductive layer 213a and the outer lower conductive layer 213b are disposed below the interlayer insulating layer 130. In addition, inner lower conductive layer 213a and the outer lower conductive layer 213b may be disposed on the gate insulating layer 120. The inner lower conductive layer 213a is disposed in the encapsulation area EA. The outer lower conductive layer 213b is disposed in the non-encapsulation layer NEA. The inner lower conductive layer 213a may be a conductive layer disposed below the interlayer insulating layer 130 in the encapsulation area EA and may be formed by patterning. The outer lower conductive layer 213b may be a conductive layer disposed below the interlayer insulating layer 130 in the non-encapsulation area NEA and may be formed by patterning. The gate electrode G of the TFT 210 may also correspond to the inner lower conductive layer 213a. For example, the gate electrode G may be disposed on a same layer as a layer in which the inner lower conductive layer 213a is disposed. The inner lower conductive layer 213a and the outer lower conductive layer 213b may be a single layer or a multi-layer including a conductive material including Mo, Al, Cu, and/or Ti, etc.

The inner conductive layer 215a may be connected to the inner lower conductive layer 213a via a first inner contact hole C1 and may be connected to the semiconductor layer 211 via the second inner contact hole C2. The outer conductive layer 215b may be connected to the outer lower conductive layer 213b via the outer contact hole OC.

The inner conductive layer 215a may be electrically connected to the inner lower conductive layer 213a via the first inner contact hole C1 passing through the interlayer insulating layer 130. The first inner contact hole C1 is a through hole exposing the upper surface of the inner lower conductive layer 213a. The inner conductive layer 215a may contact the inner lower conductive layer 213a while filling the first inner contact hole C1 with a conductive material.

Thus, the inner conductive layer 215a may be electrically connected to the inner lower conductive layer 213a.

The inner conductive layer 215a may be electrically connected to the semiconductor layer 211 via the second inner contact hole C2 passing through the interlayer insulating layer 130 and the gate insulating layer 120. The second inner contact hole C2 is a through hole exposing the upper surface of the semiconductor layer 211. The inner conductive layer 215a may contact the semiconductor layer 211 while filling the second inner contact hole C2 with a conductive material. Thus, the inner conductive layer 215a may be electrically connected to the semiconductor layer 211.

The outer conductive layer 215b may be connected to the outer lower conductive layer 213b via the outer contact hole OC passing through the interlayer insulating layer 130. The outer contact hole OC is a through hole exposing the upper surface of the outer lower conductive layer 213b and may contact the outer lower conductive layer 213b while filling the outer contact hole OC with a conductive material. Thus, the outer conductive layer 215b may be electrically connected to the outer lower conductive layer 213b.

In the display device according to exemplary embodiments of the present inventive concept, the outer contact hole OC has a shape different from that of the first inner contact hole C1 and/or the second inner contact hole C2. For example, the slope of the lateral wall of the outer contact hole OC may have a slope less steep (e.g., with a smaller incline) than the slope of the lateral wall of the first inner contact hole C1 and/or the slope of the lateral wall of the second inner contact hole C2. For example, a slope angle θ3 formed by the lateral wall of the outer contact hole OC with respect to the upper surface of the substrate 100 may be less than a slope angle θ1 formed by the lateral wall of the first inner contact hole C1 with respect to the upper surface of the substrate 100. In addition, the slope angle θ3 formed by the lateral wall of the outer contact hole OC with respect to the upper surface of the substrate 100 may be less than a slope angle θ2 formed by the lateral wall of the second inner contact hole C2 with respect to the upper surface of the substrate 100. In an exemplary embodiment of the present inventive concept, the slope angle θ1 formed by the lateral wall of the first inner contact hole C1 and the slope angle θ2 formed by the lateral wall of the second inner contact hole C2 may be substantially the same.

Since the outer conductive layer 215b is formed in conformity with the shape of the outer contact hole OC while filling the outer contact hole OC to a predetermined thickness, the probability that a crack occurs in or on the outer conductive layer 215b may be high. For example, when the slope of the lateral wall of the outer contact hole OC is steep, a degree in which the outer conductive layer 215b is bent at an edge portion, where the lateral wall of the outer contact hole OC is exposed to the upper surface of the interlayer insulating layer 130, may be severe. Thus, the probability of crack occurring in or on the outer conductive layer 215b may be high.

Since the outer conductive layer 215b is disposed in the non-encapsulation area NEA, when a crack occurs in the outer conductive layer 215b, external elements of the environment such as moisture, oxygen, etc. react to the outer conductive layer 215b. Thus, a possibility that the outer conductive layer 215b corrodes is high. Further, there is a possibility that moisture, oxygen, etc. may penetrate up to the outer lower conductive layer 213b via the crack that has occurred in the outer conductive layer 215b. Therefore, a gentle slope (e.g., a slope with a low incline) of the lateral wall of the outer contact hole OC may denote that the outer conductive layer 215b and the outer lower conductive layer 213b may be prevented from being corroded by preventing occurrence of a crack in the outer conductive layer 215b.

In an exemplary embodiment of the present inventive concept, the slope angle θ3 formed by the lateral wall of the outer contact hole OC with respect to the upper surface of the substrate 100 may be approximately 10 to 60°. Forming the slope angle θ3 less than about 10° may be difficult to form due to a limit in space. In addition, the occurrence of a crack may be remarkably reduced by forming the slope angle θ3 equal to or less than about 60°.

In addition, since the first inner contact hole C1 and the second inner contact hole C2 are located in the encapsulation area EA, a penetration path of elements from the external environment such as moisture, oxygen, etc. are blocked. Therefore, even when the slopes of the lateral walls of the first inner contact hole C1 and the second inner contact hole C2 are steeper than the slope of the lateral wall of the outer contact hole OC and a crack occurs, the probability of corrosion of the inner conductive layer 215a and the inner lower conductive layer 213a occurring may be low. Also, forming the slopes of the lateral walls of the first inner contact hole C1 and the second inner contact hole C2 steeper than the slope of the lateral wall of the outer contact hole OC may denote that a space occupied by the contact hole may be reduced.

Figure 5A:
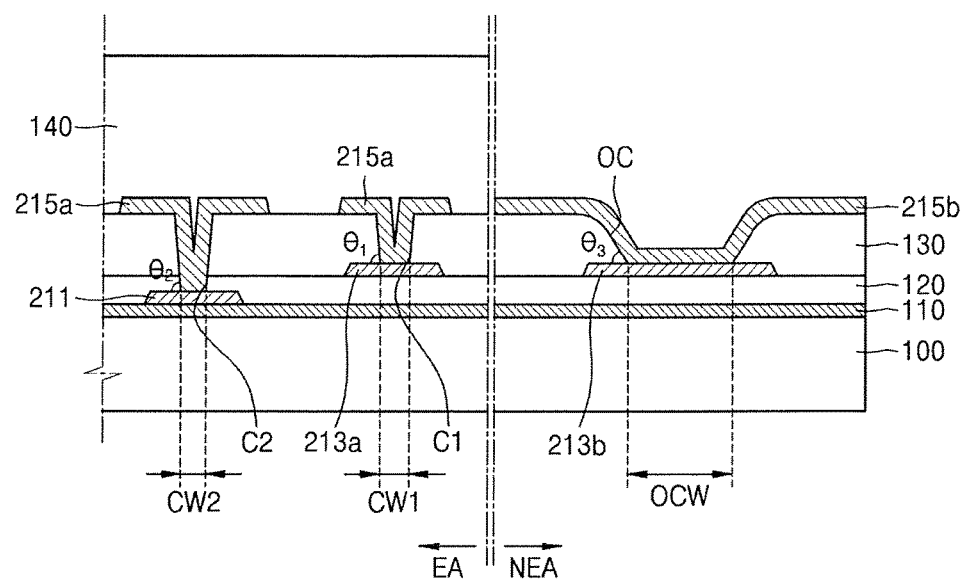
FIG. 5A is a cross-sectional view of a portion of a display device according to an exemplary embodiment of the present inventive concept.
Figure 5B:
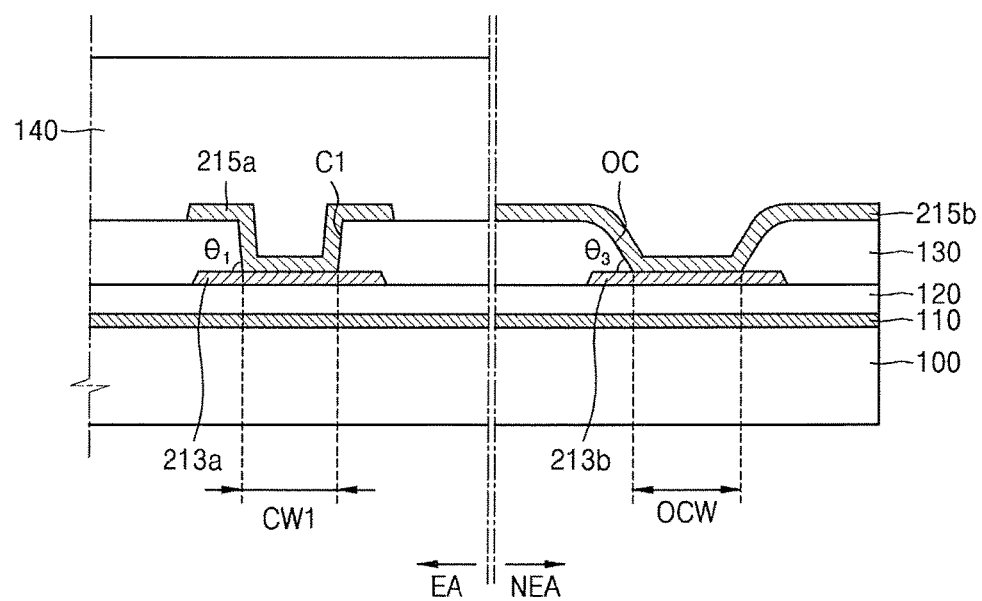
FIG. 5B is a cross-sectional view of a portion of a display device according to an exemplary embodiment of the present inventive concept.
Figure 5C:
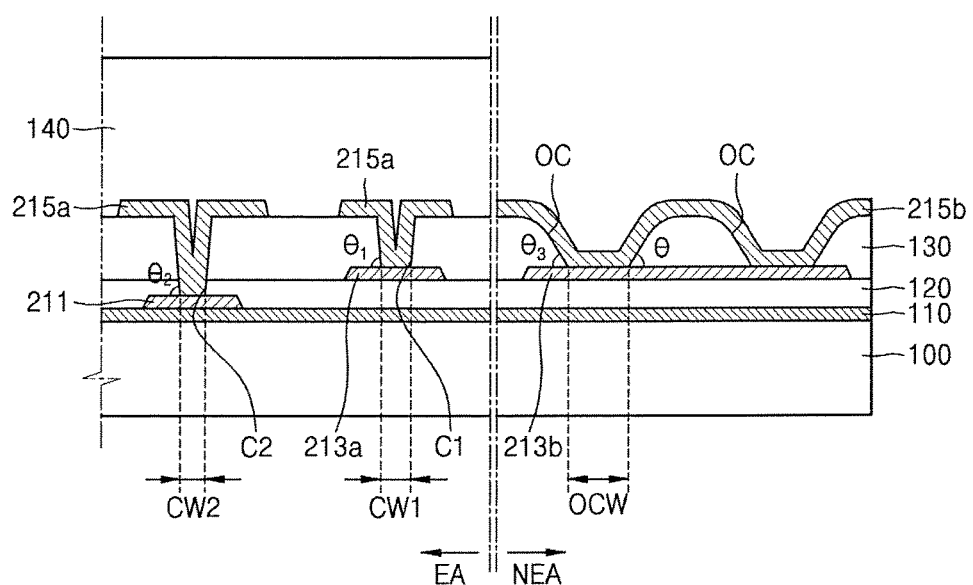
FIG. 5C is a cross-sectional view of a portion of a display device according to an exemplary embodiment of the present inventive concept.
Figure 5D:
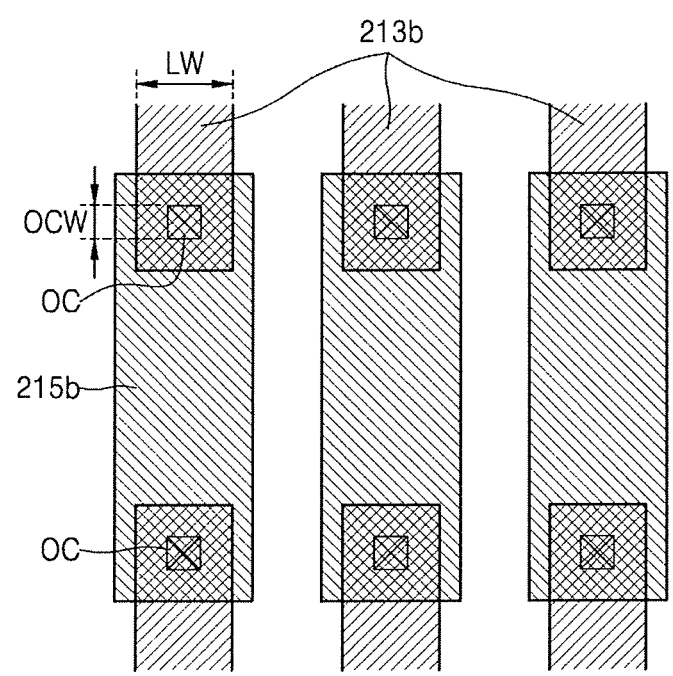
FIG. 5D is a plan view of a portion of a display device according to an exemplary embodiment of the present inventive concept.
Figure 5E:
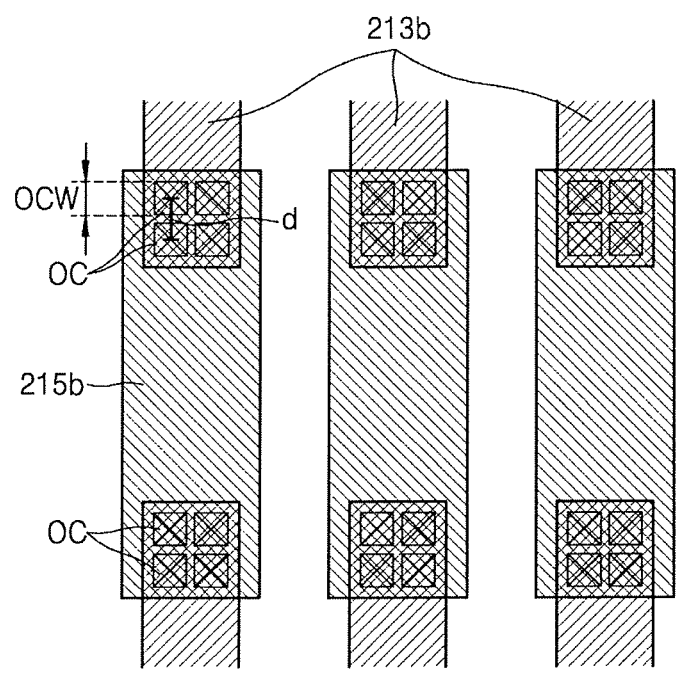
FIG. 5E is a plan view of a portion of a display device according to an exemplary embodiment of the present inventive concept.

FIGS. 5A to 5C are cross-sectional views of a portion of a display device according to exemplary embodiments of the present inventive concept. Further, FIGS. 5A to 5C are cross-sectional views of the vicinity of the first inner contact hole C1, the second inner contact hole C2, and the outer contact hole OC. FIGS. 5D and 5E are plan views of a portion of a display device according to exemplary embodiments of the present inventive concept. Further, FIGS. 5D and 5E illustrate the vicinity of the outer contact hole OC.

Referring to FIG. 5A, the outer contact hole OC may have an area greater than that of the first inner contact hole C1. In addition, the outer contact hole OC may have an area greater than that of the second inner contact hole C2. Further, FIG. 5A illustrates that the width OCW of the outer contact hole OC is greater than the width CW1 of the first inner contact hole C1 and the width CW2 of the second inner contact hole C2. Here, the area of the contact hole may be defined as the area of a lower layer exposed by the contact hole. FIG. 5A illustrates that the area of the outer contact hole OC may be defined by the area of a region of the outer lower conductive layer 213b that is exposed by the outer contact hole OC.

A fact that the area of the outer contact hole OC is wide may denote that contact force between the outer conductive layer 215b and the outer lower conductive layer 213b may be reinforced and a contact resistance reduces. Since the non-encapsulation area NEA has more space than the encapsulation area EA where wirings are concentrated, electric reliability may be pursued by making the area of the outer contact hole OC greater than the areas of the inner contact holes C1 and C2. For example, the width OCW of the outer contact hole OC may be increased to increase the area of the outer contact hole OC.

The size of the outer contact hole OC may be determined by taking into account the sizes of portions simultaneously etched with the outer contact hole OC such as the inner contact holes C1 and C2. When a difference between the size of the outer contact hole OC and the sizes of the portions simultaneously etched with the outer contact hole OC such as the inner contact holes C1 and C2 is high, a phenomenon where an etch rate of a portion of a large etched area is high and an etch rate of a portion of a small etched area is low may occur during an etching process. Therefore, the size of the outer contact hole OC may be determined by taking into account the simultaneously etched portions. In an exemplary embodiment of the present inventive concept, the width OCW of the outer contact hole OC may be about four times to ten times greater than the width CW1 of the first inner contact hole C1 or the width CW2 of the second inner contact hole C2. In an exemplary embodiment of the present inventive concept, the width CW1 of the first inner contact hole C1 may be one to one and a half times greater than the width CW2 of the second inner contact hole C2.

In addition, referring to FIG. 5A, the slope of the lateral wall of the outer contact hole OC is less steep (e.g., a smaller incline) than the slopes of the lateral walls of the inner contact holes C1 and C2. Therefore, a probability of a corrosion occurrence of the outer conductive layer 215b and the outer lower conductive layer 213b that may occur in the non-encapsulation area NEA may be reduced by reducing a probability of crack occurring on or in the outer conductive layer 215b.

Referring to FIG. 5B, the size of the first inner contact hole C1 and/or the second inner contact hole C2 (e.g., see FIG. 5A) may be modified variously. For example, the area of the first inner contact hole C1 may be substantially the same as or greater than the area of the outer contact hole OC. Thus, FIG. 5B illustrates that the width CW1 of the first inner contact hole C1 is similar to the width OCW of the outer contact hole OC.

In addition, referring to FIG. 5B, the slope of the lateral wall of the outer contact hole OC is less steep (e.g., a smaller incline) than the slope of the lateral wall of the first inner contact hole C1. Therefore, a probability of a corrosion occurrence of the outer conductive layer 215b and the outer lower conductive layer 213b that may occur in the non-encapsulation area NEA may be reduced by reducing a probability of a crack occurring in or on the outer conductive layer 215b.

Referring to FIG. 5C, a plurality of outer contact holes OC may be adjacent to one another. Therefore, contact force between the outer conductive layer 215b and the outer lower conductive layer 213b may increase and a contact resistance may reduce.

In addition, referring to FIG. 5C, the slope of the lateral wall of the outer contact hole OC is less steep (e.g., a smaller incline) than the slopes of the lateral walls of the first and second inner contact holes C1 and C2. Therefore, a probability of a corrosion occurrence of the outer conductive layer 215b and the outer lower conductive layer 213b which may occur in the non-encapsulation area NEA may be reduced by reducing a probability of a crack occurring on or in of the outer conductive layer 215b.

Referring to FIGS. 5D and 5E, the outer conductive layer 215b may be connected to the outer lower conductive layer 213b by using one outer contact hole OC as illustrated in FIG. 5D. The outer conductive layer 215b may be connected to the outer lower conductive layer 213b by disposing a plurality of outer contact holes OC adjacent to one another. In an exemplary embodiment of the present inventive concept, the width OCW of the outer contact hole OC might not be formed to be about the width LW of the outer lower conductive layer 213b. Further, in view of a contact resistance and a process, the outer conductive layer 215b may contact the outer lower conductive layer 213b by disposing the plurality of outer contact holes OC adjacent with consideration of a region of a simultaneously etched portion while the outer contact hole OC is etched. In an exemplary embodiment of the present inventive concept, a fact that the plurality of outer contact holes OC are adjacent to one another may denote that a distance d between the centers of adjacent outer contact holes OC is within two times the width OCW of one outer contact hole OC. For example, the distance d between the center of a first outer contact hole and a second outer contact hole may be one and a half times the width OCW of one outer contact hole.

In addition, as described above, the inner contact holes C1 and C2 and the outer contact hole OC may be formed simultaneously. First, a photoresist pattern is formed by using a mask over the substrate 100 including the semiconductor layer 211, the gate insulating layer 120, the inner lower conductive layer 213a, the outer lower conductive layer 213b, and the interlayer insulating layer 130. Subsequently, the first inner contact hole C1 and the outer contact hole OC respectively exposing the inner lower conductive layer 213a and the outer lower conductive layer 213b are formed by etching the interlayer insulating layer 130. In this case, the gate insulating layer 120 is also etched, and the second inner contact hole C2 exposing the semiconductor layer 211 may be simultaneously formed in the etching process. The etching process may be performed by using wet etching, dry etching, or a combination thereof.

FIGS. 6A to 6D are views of a portion of a mask used for forming the inner contact holes C1 and C2 and the outer contact hole OC according to an exemplary embodiment of the present inventive concept.

Referring to FIGS. 6A to 6D, masks M1, M2, M3, and M4 may include an inner contact hole pattern 700 for forming the inner contact holes C1 and C2 and an outer contact hole pattern 800 for forming the outer contact hole OC. The inner contact hole pattern 700 may include a shape substantial similar to polygon or a circle. The inner contact hole pattern 700 may be a light-shielding portion or a transmission portion depending on a characteristic of a photoresist being used. For example, in the case where the photoresist is negative, the inner contact hole pattern 700 may be formed as a light-shielding portion. The light-shielding portion is a region that shields light. When light is shielded by the light-shielding portion and light is not transferred to the negative photoresist, a relevant portion of the photoresist is removed and a photoresist pattern is formed. In contrast, in the case where the photoresist is positive, the inner contact hole pattern 700 may be formed as a transmission portion. For example, the transferring portion may transmit light.

Even though FIGS. 6A to 6D illustrate that the inner contact hole pattern 700 includes a square shape, the exemplary embodiment of the present inventive concept is not limited thereto. For example, the inner contact hole pattern 700 may include various shapes such as a shape substantially similar to a polygon, a circle, an elliptical, and an irregular shape.

The outer contact hole pattern 800 for forming the outer contact hole OC may have a width MOCW greater than the width MCW of the inner contact hole pattern 700. In an exemplary embodiment of the present inventive concept, the outer contact hole pattern 800 may have the width MOCW between about four times to ten times greater than the width MCW of the inner contact hole pattern 700.

Figure 6A:
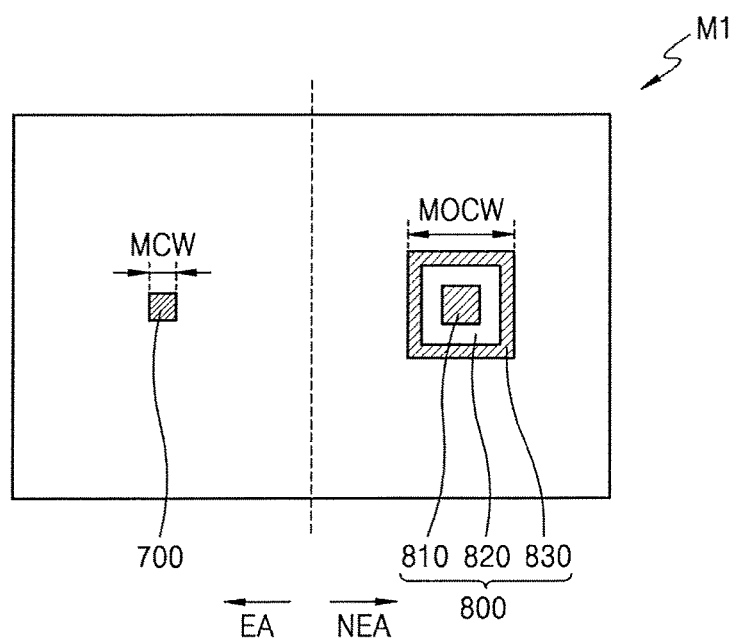
FIG. 6A is a plan view of a portion of a mask for manufacturing a display device according to an exemplary embodiment of the present inventive concept.

Referring to FIG. 6A, the outer contact hole pattern 800 may include a central portion 810, a spaced portion 820, and a circumferential portion 830. The circumferential portion 830 may surround the central portion 810. The spaced portion 820 is disposed between the circumferential portion 830 and the central portion 810. In addition, the central portion 810 and the circumferential portion 830 may have the same properties with respect to light. The spaced portion 820 and the central portion 810 may have opposite properties with respect to light.

In the case where the central portion 810 and the circumferential portion 830 are light-shielding portions, the spaced portion 820 may be included as a light transmission portion. In the case where the central portion 810 and the circumferential portion 830 are light transmission portions, the spaced portion 820 may be included as a light-shielding portion. The central portion 810 may include various shapes such as shapes substantially similar to a polygon, circle, an elliptical, and an irregular shape. The circumferential portion 830 may include a ring shape of various forms.

In the case where the central portion 810 is spaced apart from the circumferential portion 830 by the spaced portion 820 as described above, the thickness of the photoresist pattern may be adjusted by an interference phenomenon of light. In addition to adjusting the thickness of the photoresist pattern, the slope of the lateral wall of the outer contact hole OC may be adjusted by an etching process using this photoresist pattern.

Figure 6B:
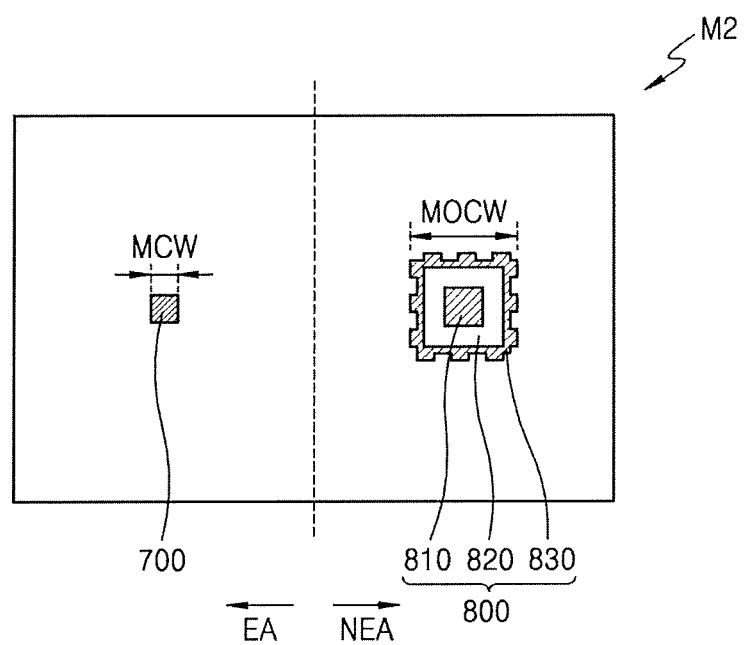
FIG. 6B is a plan view of a portion of a mask for manufacturing a display device according to an exemplary embodiment of the present inventive concept.

Referring to FIG. 6B, the outer contact hole pattern 800 may include the central portion 810, the spaced portion 820, and the circumferential portion 830. The circumferential portion 830 may surround the central portion 810. The spaced portion 820 is disposed between the circumferential portion 830 and the central portion 810. The central portion 810 may include various shapes such as shapes substantially similar to a polygon, a circle, an elliptical and an irregular shape. The circumferential portion 830 may include a ring shape of various forms.

The circumferential portion 830 may include an irregular pattern along an outer circumferential surface of the circumferential portion 830. For example, the irregular pattern may be disposed along an outer circumference or an outer parameter of the circumferential portion 830. By using this shape, interference of light may be formed and the thickness of the photoresist pattern may be adjusted.

Figure 6C:
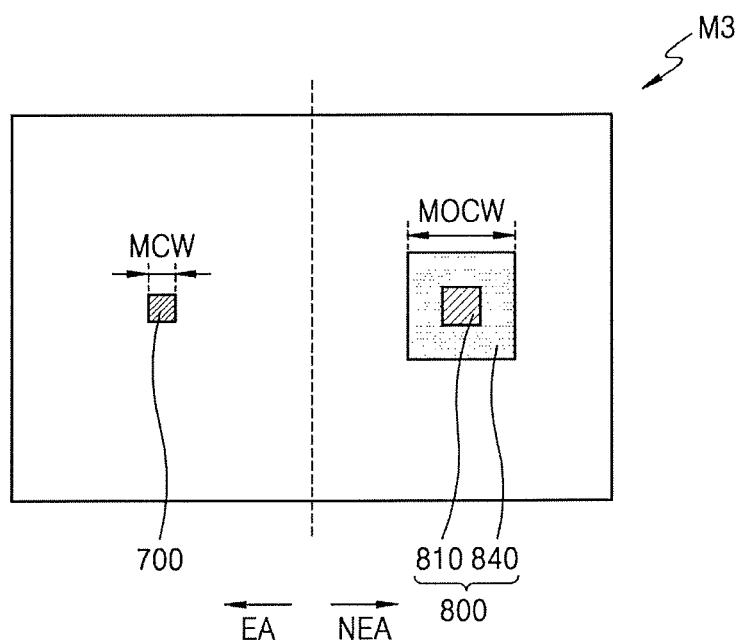
FIG. 6C is a plan view of a portion of a mask for manufacturing a display device according to an exemplary embodiment of the present inventive concept.

Referring to FIG. 6C, the outer contact hole pattern 800 may include the central portion 810 and a semi-transmission portion 840 surrounding the central portion 810. The semi-transmission portion 840 may be a region that adjusts a degree of light transmission. The adjustment of a degree of light transmission by the semi-transmission portion 840 may be set such that a degree of light transmission gradually increases or decreases from the center to the outer portion thereof.

The thickness of the photoresist pattern may be adjusted by the outer contact hole pattern 800 as described above, and the slope of the lateral wall of the outer contact hole OC may be adjusted by an etching process using this photoresist pattern.

Figure 6D:
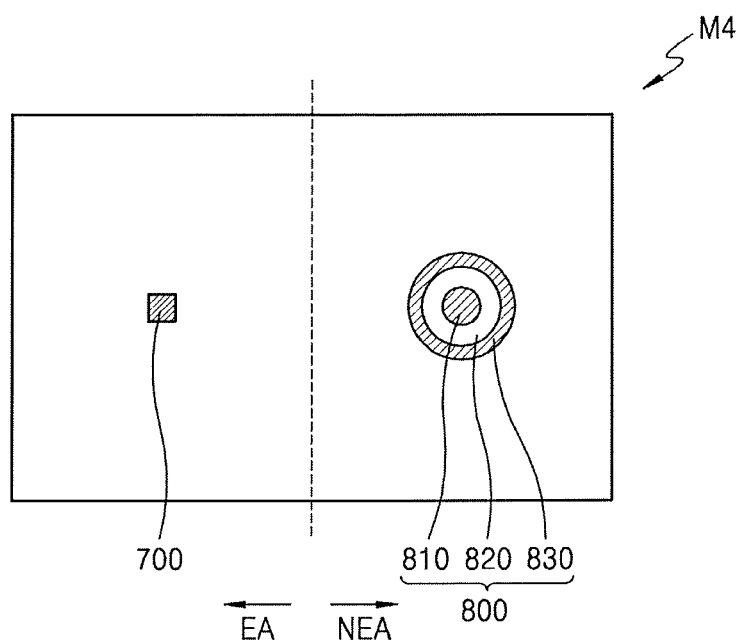
FIG. 6D is a plan view of a portion of a mask for manufacturing a display device according to an exemplary embodiment of the present inventive concept.

Referring to FIG. 6D, the outer contact hole pattern 800 may include the central portion 810, the spaced portion 820, and the circumferential portion 830. The circumferential portion 830 may surround the central portion 810. The spaced portion 820 is arranged between the circumferential portion 830 and the central portion 810. Referring to FIG. 6D, the central portion 810 includes a circular shape and the circumferential portion 830 includes a circular ring shape (e.g., the circumferential portion 830 includes opening in the central portion). The shapes of the central portion 810 and the circumferential portion 830 may be changed to various shapes.

The thickness of the photoresist pattern may be adjusted by the outer contact hole pattern 800 as described above, and the slope of the lateral wall of the outer contact hole OC may be adjusted by an etching process using this photoresist pattern.

Figure 7:
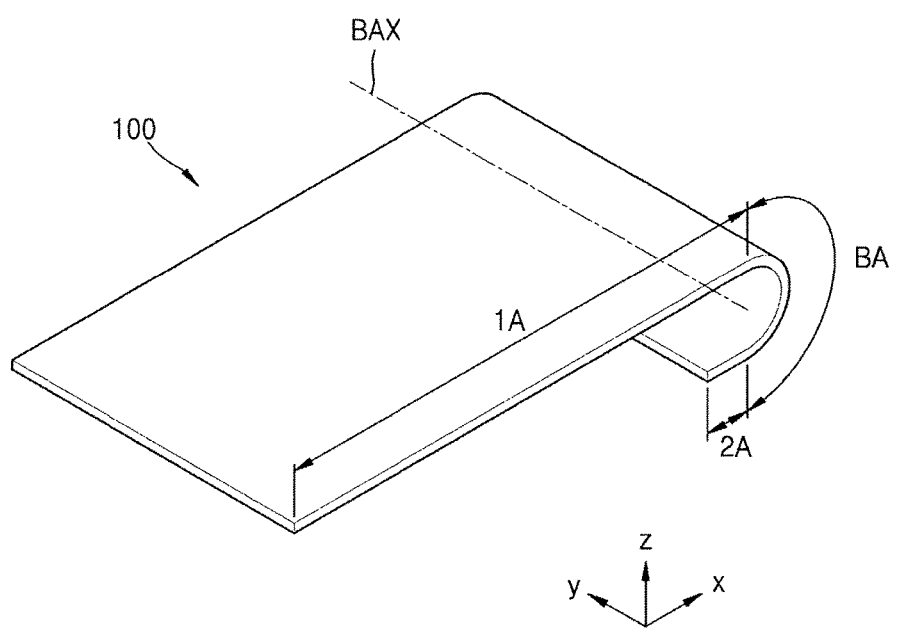
FIG. 7 is a perspective view of a portion of a display device according to an exemplary embodiment of the present inventive concept.
Figure 8A:
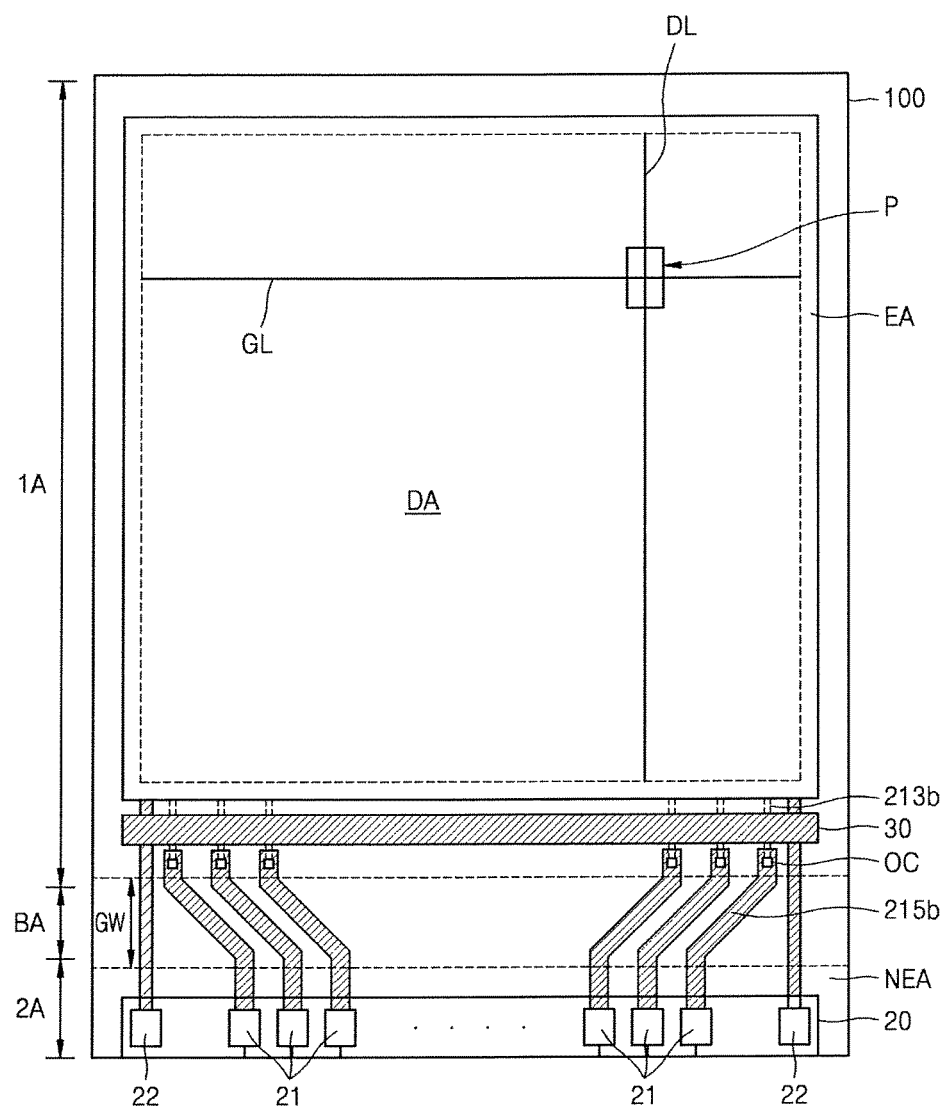
FIG. 8A is a plan view of a portion of the display device of FIG. 7.
Figure 8B:
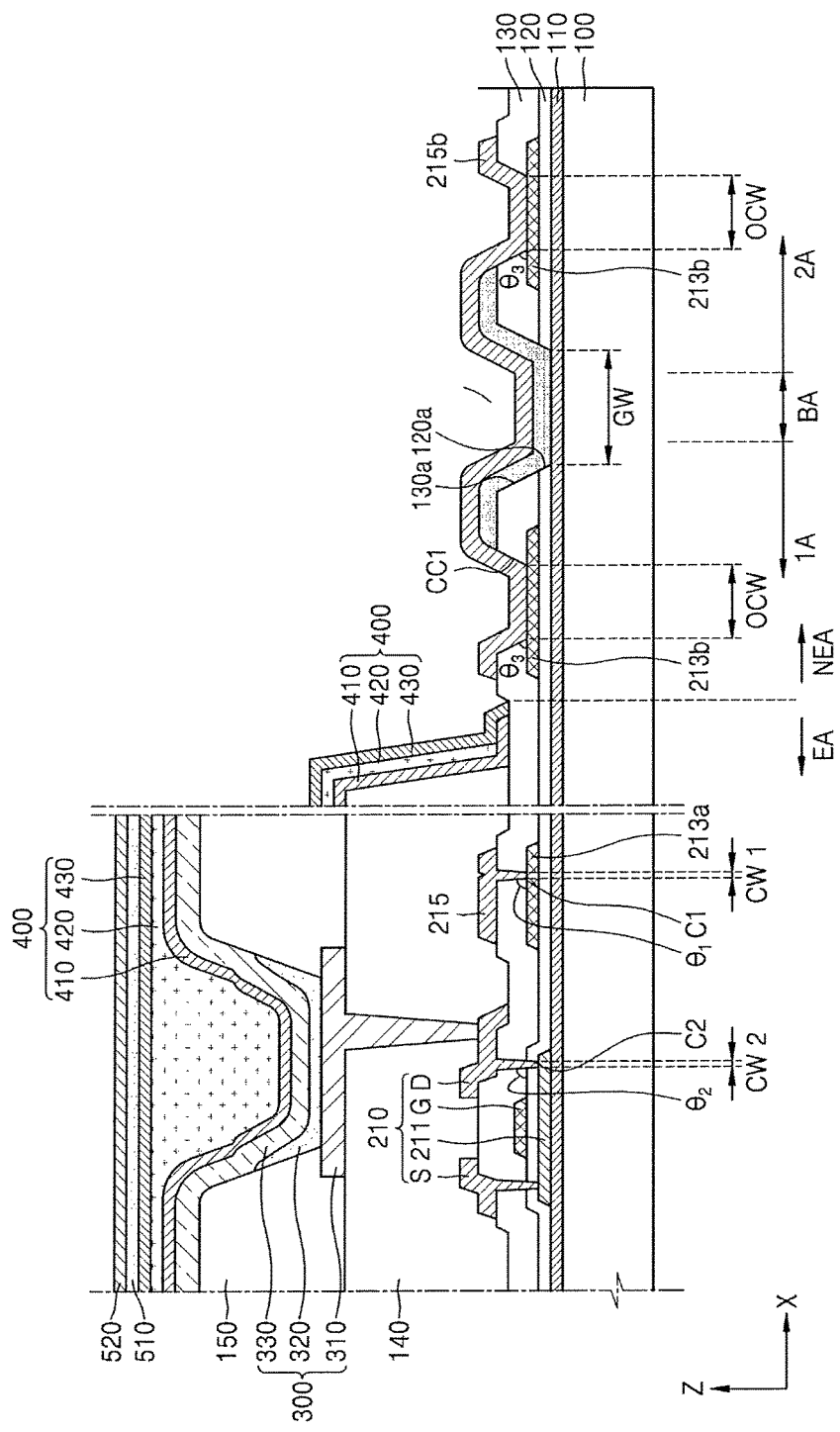
FIG. 8B is a cross-sectional view of a portion of the display device of FIG. 7.

FIG. 7 is a perspective view of a portion of a display device according to an exemplary embodiment of the present inventive concept. FIG. 8A is a plan view of a portion of the display device of FIG. 7 according to an exemplary embodiment of the present inventive concept. FIG. 8B is a cross-sectional view of a portion of the display device of FIG. 7 according to an exemplary embodiment of the present inventive concept. As illustrated in FIG. 7, the display device according to an exemplary embodiment of the present inventive concept may include a portion of the substrate 100 that is bent, and the display device has a shape partially bent like the substrate 100. For reference, cross-sectional views or plan views of exemplary embodiments of the present inventive concept below illustrate that the display device is not bent for convenience of illustration.

As illustrated in FIGS. 7 to 8B, the substrate 100 of the display device according to an exemplary embodiment of the present inventive concept has a bending area BA extending in a first direction (e.g., in a positive y-axis direction). The bending area BA is disposed between a first region 1A and a second region 2A in a second direction (e.g., in a positive x-axis direction) extending over the first direction (e.g., in the positive y-axis direction). Also, as illustrated in FIG. 7, the substrate 100 is bent around a bending axis BAX extending in the first direction (e.g., in the positive y-axis direction).

Referring to FIG. 8A, the display device according to an exemplary embodiment includes the substrate 100 divided into the encapsulation area EA encapsulating the display area DA and the non-encapsulation area NEA, and the outer conductive layer 215b disposed in the non-encapsulation area NEA. Also, the non-encapsulation area NEA includes the bending area BA.

The outer conducive layer 215b denotes a conductive layer disposed in the non-encapsulation area NEA and may be a conductive layer forming a portion of an electric device such as a wiring or a TFT arranged in the non-encapsulation area NEA. For example, the outer conductive layer 215b may be a wiring transferring a data signal, a gate signal, etc. from a driver IC mounted on the pad portion 20.

In this case, the outer conductive layer 215b may have a structure connected to an outer lower conductive layer 213b disposed in a different layer via an outer contact hole OC. The driving power line 30 disposed in the same layer as a layer in which the outer conductive layer 215b is disposed may be disposed in the non-encapsulation area NEA. The driving power line 30 may be connected to the driver IC via a driving terminal 22 and may provide a driving voltage ELVDD provided from the driver IC to pixels P. The driving power line 30 may cover one lateral surface of the display area DA. In this case, signal lines supplying a data signal or a gate signal to the display area DA including the outer conductive layer 215b cross the driving power line 30. The outer conductive layer 215b may be connected to the outer lower conductive layer 213b via the outer contact hole OC to avoid a collision in a cross region with the driving power line 30.

The outer conductive layer 215b may extend from the first region 1A to the second region 2A by being bent around bending area BA. In this case, occurrence of a defect such as a crack in or on the outer conductive layer 215b or disconnection of the outer conductive layer 215b may be prevented by allowing the outer conductive layer 215b to include a material having a high elongation value. Also, efficiency of a transfer of an electric signal may increase in the display device. In addition, a rate at which a defect occurs during the manufacturing process may be reduced by forming the outer lower conductive layer 213b using a material having an elongation value lower than that of the outer conductive layer 215b; however, the material would have electrical/physical characteristics different from those of the outer conductive layer 215b in the first region 1A or the second region 2A. For example, the outer lower conductive layer 213b may include Mo, and the outer conductive layer 215b may include Al. In addition, the outer conductive layer 215b or the outer lower conductive layer 213b may have a multi-layered structure.

Referring to FIG. 8B, the buffer layer 110 may be continuous over the first region 1A, the bending area BA, and the second region 2A. Also, the gate insulating layer 120 may include the opening 120a corresponding to the bending area BA, and the interlayer insulating layer 130 may include the opening 130a corresponding to the bending area BA. For example, the openings 120a and 130a may be aligned with the bending area BA. In addition, the buffer layer 110, the gate insulating layer 120, and the interlayer insulating layer 130 including an inorganic material may be generally referred to as an inorganic insulating layer. Therefore, the inorganic insulating layer including the buffer layer 110, the gate insulating layer 120, and the interlayer insulating layer 130 may be understood as having a groove corresponding to the bending area BA. The groove may be defined by a recess including the upper surface of the buffer layer 110, the opening 120a of the gate insulating layer 120, and the opening 130a of the interlayer insulating layer 130. For example, the groove may be an opening in the non-encapsulation area NEA. In addition, the inorganic insulating layer may include the groove in various forms different from this groove. For example, a portion of the upper surface (e.g., in a positive z-axis direction) of the buffer layer 110 may be also removed. In addition, the lower surface (e.g., in a negative z-axis direction) of the gate insulating layer 120 may not be removed but may remain, and various modifications may be made.

A fact that the groove corresponds to the bending area may denote that the groove overlaps the bending area BA. For example, the display device may bend at the groove overlapping the bending area BA. In this case, the groove may have an area greater than the area of bending area BA. For this purpose, FIG. 8B illustrates that the groove has a width GW greater than the width of the bending area BA. Here, the area of the groove may be defined as the area of the opening having a smallest area from among the openings 120a and 130a of the gate insulating layer 120 and the interlayer insulating layer 130, respectively. FIG. 8B illustrates that the area of the groove is defined by the area of the opening 120a of the gate insulating layer 120.

The display device according to the exemplary embodiment of the present inventive concept may include an organic layer 160 filling at least a portion of the groove of the inorganic insulating layer. Also, the outer conductive layer 215b may extend from the first region 1A to the second region 2A by way of the bending area BA and may be located over the organic layer 160. In addition, the outer conductive layer 215b may be disposed over the inorganic insulating layer such as the interlayer insulating layer 130 in a region where the organic layer 160 does not exist.

Figure 9A:
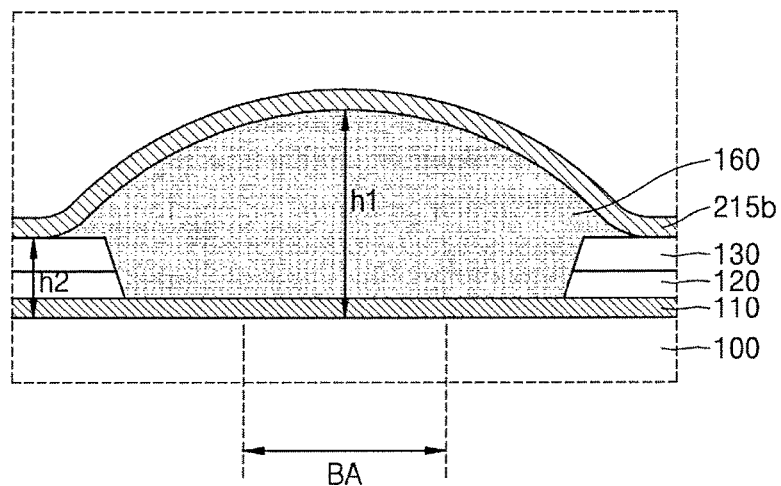
FIG. 9A is a cross-sectional view of a portion of a display device according to an exemplary embodiment of the present inventive concept.

Even though FIG. 8B illustrates that the display device is not bent for convenience as described above, in the display device according to the exemplary embodiment of the present inventive concept, the substrate 100, etc. is bent in the bending area BA as illustrated in FIG. 7. For this purpose, the display device is manufactured such that the substrate 100 is approximately planarized as illustrated in FIG. 8B during the manufacturing process. After being approximately planarized, the display device is allowed to have the approximate shape illustrated in FIG. 7 by bending the substrate 100, etc. in the bending area BA. In this case, tensile stress may be applied to the outer conductive layer 215b while the substrate 100, etc. are bent, but the display device according to the exemplary embodiment of the present inventive concept may prevent or minimize the probability of a defect occurring in or on the outer conductive layer 215b during the bending process by using the groove of the inorganic insulating layer and the organic layer 160 (e.g., as illustrated in FIG. 9A). For example, the bending of the substrate may be occurring at the groove corresponding to the bending area.

Since the inorganic insulating layer has a higher hardness than that of the organic layer 160, a probability that a crack occurs in the inorganic insulating layer is very high. In the case where a crack occurs in the inorganic insulating layer, a crack also occurs in the outer conductive layer 215b disposed over the inorganic insulating layer. Thus, a probability that a defect such as disconnection of the outer conductive layer 215b occurs is very high.

However, in the display device according to the exemplary embodiment of the present inventive concept, the inorganic insulating layer including the groove and a portion of the outer conductive layer 215b that corresponds to the bending area BA is disposed over the organic layer 160. Since the inorganic insulating layer may include the groove in the bending area BA, a probability that a crack occurs in or on the inorganic insulating layer may be extremely low. Also, a probability that a crack occurs in or on the organic layer 160 based on characteristics of the organic layer 160 including an organic material may be low. Therefore, occurrence of a crack, etc. in a portion of the outer conductive layer 215b that corresponds to the bending area BA (e.g., aligned with the bending area BA) and that is aligned with or overlaps the organic layer 160 may be prevented or minimized. In addition, since the organic layer 160 has lower hardness than that of the inorganic insulating layer, the organic layer 160 may minimize a concentration of tensile stress on the outer conductive layer 215b by absorbing the tensile stress occurring as a result of bending the substrate 100, etc.

In addition, in an exemplary embodiment of the present inventive concept, the organic layer 160 (e.g., as illustrated in FIG. 9A) may cover the inner lateral surface of the groove of the inorganic insulating layer. Various wirings of the display device may be formed by forming a conductive material layer over an entire surface of the substrate 100 and then patterning the wirings. If the organic layer 160 does not cover the inner lateral surface of the opening 120a of the gate insulating layer 120 or the inner lateral surface of the opening 130a of the interlayer insulating layer 130, a conductive material of the conductive material layer may not be removed from the inner lateral surface of the opening 120a or the inner lateral surface of the opening 130a. However, the conductive material of the conductive material layer may remain on the relevant surface during a process of patterning the conductive material layer. As a result, the remaining conductive material may cause short circuit between other conductive layers. Therefore, covering the inner lateral surface of the groove of the inorganic insulating layer with the organic layer 160 may prevent a short circuit between conductive layers.

The groove may be simultaneously formed during a patterning process of forming the outer contact hole OC and the inner contact holes C1 and C2. The area of the outer contact hole OC may be determined by taking into account the area of the groove. When there is a difference between area of the outer contact hole OC and the area of the groove adjacent to the outer contact hole OC, a phenomenon where an etching rate of a portion having a large etch area is high and an etching rate of a portion having a relatively small etch area is low may occur.

Therefore, the size of the outer contact hole OC may be determined by taking into account a simultaneously etched portion and a degree of being adjacent to the etched portion. Accordingly, the outer contact hole OC may have an area greater than the areas of the inner contact holes C1 and C2. In an exemplary embodiment of the present inventive concept, the outer contact hole OC may have an area greater than the areas of the inner contact holes C1 and C2 and less than the area of the groove. FIG. 8B illustrates that the groove has a width GW greater than the width OCW of the outer contact hole OC. In addition, the widths CW1 and CW2 of the inner contact holes C1 and C2, respectively, are less than the width OCW of the outer contact hole OC. In an exemplary embodiment of the present inventive concept, the outer contact hole OC may have the width OCW, which may be about four times to ten times greater than the widths CW1 and CW2 of the inner contact holes C1 and C2, respectively.

In addition, referring to FIG. 8B, the slope of the lateral wall of the outer contact hole OC is less steep (e.g., a smaller incline) than the slopes of the lateral walls of the first and second inner contact holes C1 and C2. Therefore, a probability of corrosion of the outer conductive layer 215b and the outer lower conductive layer 213b that may occur in the non-encapsulation area NEA may be reduced by reducing a probability of a crack occurring on or in the outer conductive layer 215b.

Figure 9B:
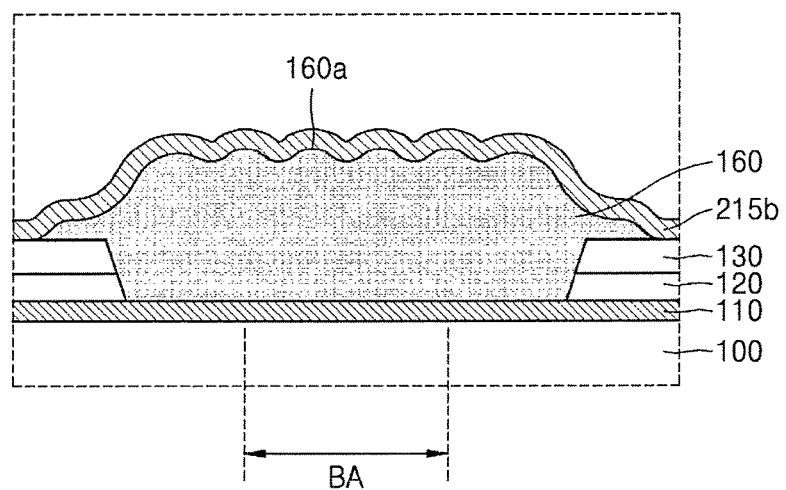
FIG. 9B is a cross-sectional view of a portion of a display device according to an exemplary embodiment of the present inventive concept.
Figure 9C:
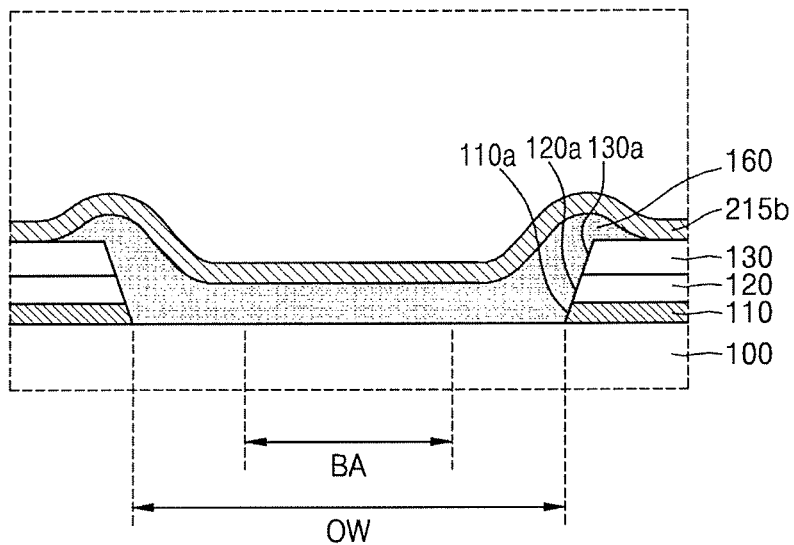
FIG. 9C is a cross-sectional view of a portion of a display device according to an exemplary embodiment of the present inventive concept.

FIGS. 9A to 9C are cross-sectional views of a portion of a display device according to an exemplary embodiment of the present inventive concept. Further, FIGS. 9A to 9C are cross-sectional views of the region of the bending area BA.

Referring to FIG. 9A, a height h1 of at least a portion of the organic layer 160 aligned over the groove of the inorganic insulating layer from the upper surface of the substrate 100 may be higher than a height h2 of the inorganic insulating layer from the upper surface of the substrate 100. As illustrated in FIG. 9A, the height of the organic layer 160 that corresponds to the central portion of the groove h1 may be higher than the height of the both ends of the groove. Further, the height of the both ends of the groove may be higher than the height h2 of the inorganic insulating layer from the upper surface of the substrate 100. The organic layer 160 may prevent a short circuit between the conductive material that may remain on the inner lateral surfaces of the groove and the outer conductive layer 215b by covering the inner lateral surface of the groove.

Referring to FIG. 9B, at least a portion of the upper surface (e.g., in the positive z-axis direction) of the organic layer 160 aligned over the groove of the inorganic insulating layer may include an irregular surface. For example, the inorganic insulating layer may include a surface substantially the same as a wave. Therefore, the surface area of the upper surface of the organic layer 160 and the surface areas of the upper and lower surfaces of the outer conductive layer 215b inside the groove may become larger. A fact that the surface areas of the upper surface of the organic layer 160 and the upper and lower surfaces of the outer conductive layer 215b are large may denote that a margin in which shapes thereof may be deformed in order to reduce tensile stress by the bending of the substrate 100, etc. increases.

Further, since the outer conductive layer 215b is disposed over the organic layer 160, the lower surface of the outer conductive layer 215b may have a shape corresponding to the irregular surface 160a of the organic layer 160. For example, if the organic layer 160 includes a surface substantially the same as a wave, then the lower surface of the outer conductive layer 215b may include a surface substantially the same as a wave too.

The irregular surface 160a of the upper surface (e.g., in the positive z-axis direction) of the organic layer 160 may be formed by using various methods. For example, a photo sensitive material is used when forming the organic layer 160, and a specific portion of the organic layer 160 may be etched (e.g., removed) relatively further in depth than other portions by differing the amount of exposure applied to a plurality of portions of the organic layer 160 whose upper surface is approximately planarized yet via a slit mask or a half-tone mask during a manufacturing process. Here, the further etched portion may be understood as a concave portion in the upper surface of the organic layer 160. Further, the method used when manufacturing the display device according to an exemplary embodiment of the present inventive concept is not limited to the above method. For example, subsequent to the organic layer 160 whose upper surface is approximately planarized is formed, only a specific portion may be removed by using dry etching, etc. and various methods may be used.

Referring to FIG. 9C, the inorganic insulating layer may have an opening corresponding (e.g., aligned) to the bending area BA. That is, the buffer layer 110, the gate insulating layer 120, and the interlayer insulating layer 130 may respectively include openings 110a, 120a, and 130a corresponding to the bending area BA. For example, the openings 110a, 120a, and 130a may be aligned with the bending area BA. A configuration in which the opening corresponds to the bending area BA may be understood as a configuration in which the opening overlaps the bending area BA. In this case, the opening may have an area greater than the area of the bending area BA. Further, FIG. 9C illustrates that the width OW of the opening is larger than the width of the bending area BA. Here, the area of the opening may be defined as the area of an opening having a smallest area from among the openings 110a, 120a, and 130a of the buffer layer 110, the gate insulating layer 120, and the interlayer insulating layer 130, respectively. For example, as illustrated in FIG. 3, the area of the opening may be defined by the area of the opening 110a of the buffer layer 110.

Since the inorganic insulating layer has a hardness greater than a hardness of the organic layer 160, a probability of a crack occurring in or on the inorganic insulating layer is very high. When a crack occurs in the inorganic insulating layer, a probability that a crack propagates (e.g., spreads) up to the outer conductive layer 215b increases. Even though a probability that a crack occurs in the inorganic insulating layer may decrease by forming the groove in the inorganic insulating layer, a probability that a crack occurs in the inorganic insulating layer may further decrease by forming the opening 110a of the buffer layer 110 in the bending area BA.

Figure 10:
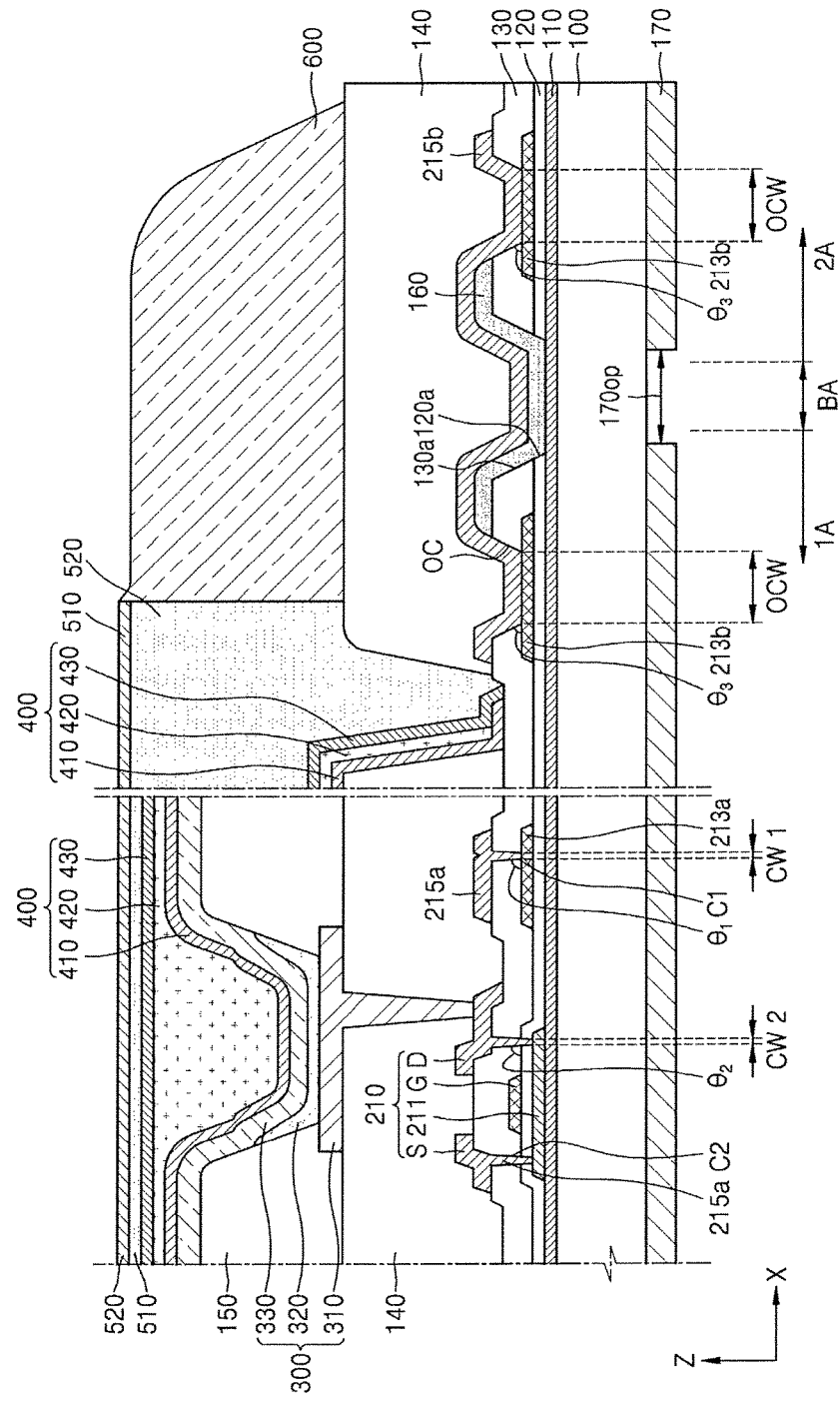
FIG. 10 is a cross-sectional view of a portion of a display device according to an exemplary embodiment of the present inventive concept.

FIG. 10 is a cross-sectional view of a portion of a display device according to an exemplary embodiment of the present inventive concept. Referring to FIG. 10, the display device may further include a stress neutralization layer (SNL) 600 and/or a protective film 170.

The SNL 600 may be disposed over the outer conductive layer 215b and may correspond to the bending area BA. For example, the SNL may overlap the bending area BA. In addition, the SNL 600 may be disposed on a planarization layer 140 in the non-encapsulation layer NEA.

When a certain stacked body is bent, a stress neutral plane exists inside the stacked body. For example, if the SNL 600 is not disposed in the display device, excessive tensile stress, etc. may be applied to the outer conductive layer 215b inside the bending area BA when the substrate 100, etc. are bent. This excessive tensile stress may be applied because the location of the outer conductive layer 215b may not correspond to the stress neutral plane. However, the location of the stress neutral plane may be adjusted in a stacked body including all of the substrate 100, the outer conductive layer 215b, the SNL 600, etc. by forming the SNL 600 and adjusting a thickness and a modulus thereof, etc. Therefore, tensile stress applied to the outer conductive layer 215b may be minimized by allowing the stress neutral plane to be disposed in the region of the outer conductive layer 215b via the SNL 600.

In an exemplary embodiment of the present inventive concept, the SNL 600 may extend up to the end of the edge of the substrate 100 of the display device. For example, at least a portion of the outer conductive layer 215b, the outer lower conductive layer 213b, and/or other conductive layers, etc. electrically connected to these layers may not be covered with the interlayer insulating layer 130 or the planarization layer 140, etc. and may be electrically connected to various electronic devices or a printed circuit board, etc. Accordingly, portions via which the outer conductive layer 215b, the outer lower conductive layer 213b, and/or other conductive layers electrically connected to these layers and are electrically connected to the various electronic devices or the printed circuit board, etc. exist. In this case, the electrically connected portion needs to be protected from impurities such as external moisture. The SNL 600 may cover even the electrically connected portions and, thus, serve as a protective layer. Further, the SNL 600 may extend, for example, up to the end of the edge of the substrate 100 of the display device.

In addition, even though FIG. 10 illustrates that the upper surface of the SNL 600 in a display area direction (e.g., in the negative x-axis direction) may coincide (e.g., may line up) with the upper surface (e.g., in the positive z-axis direction) of the polarization plate 520, the exemplary embodiment of the present inventive concept is not limited thereto. For example, the end of the SNL 600 in the display area direction (e.g., in the negative x-axis direction) may cover a portion of the edge upper surface of the polarization plate 520. In addition, in an exemplary embodiment of the present inventive concept, the end of the SNL 600 in the display area direction (e.g., in the negative x-axis direction) might not contact the polarization plate 520 and/or the optically clear adhesive (OCA) 510. Further, during or after a process of forming the SNL 600, a gas generated from the SNL 600 may be prevented from moving (e.g., spreading) in the display area direction (e.g., in the negative x-axis direction) and deteriorating the display element 300 such as an OLED.

If the upper surface of the SNL 600 extending in a display area direction (e.g., in the negative x-axis direction) coincides (e.g., lines up) with the upper surface (e.g., in the positive z-axis direction) of the polarization plate 520 as illustrated in FIG. 10, or the end of the SNL 600 extending in a display area direction (e.g., in the negative x-axis direction) covers a portion of the edge upper surface of the polarization plate 520, or the end of the SNL 600 extending in a display area direction (e.g., in the negative x-axis direction) contacts the OCA 510, the thickness of a section of the SNL 600 extending in a display area direction (e.g., in the negative x-axis direction) may be greater than the thickness of the other sections of the SNL 600. Since a liquefied or paste type material is coated and cured when forming the SNL 600, the volume of the SNL 600 may decrease during the curing process. In the case where the portion of the SNL 600 extending in the display area direction (e.g., in the negative x-axis direction) contacts the polarization plate 520 and/or the OCA 510, since the location of the relevant portion of the SNL 600 is fixed, the volume of the remaining portion of the SNL 600 may be reduced. As a result, the thickness of the portion of the SNL 600 extending in the display area direction (e.g., in the negative x-axis direction) may be greater than the thickness of the other portions of the SNL 600.

The protective film 170 may be a lower protective film protecting the lower surface of the substrate 100. For example, the protective film 170 may be disposed on a surface of the substrate opposite to another surface of the substrate on which the inorganic insulating layer is disposed. The protective film 170 may further include an opening 170op as illustrated in FIG. 10. The opening 170op corresponds to the bending area BA and may have an area greater than the area of the bending area BA. For example, the opening 170op overlaps or aligns with the bending area BA. FIG. 10 illustrates that the opening 170op may have a width greater than the width of the bending area BA.

Since the protective film 170 protects the lower surface of the substrate 100, the protective film 170 may have strength in itself. Therefore, in the case where the protective film 170 has low flexibility, the protective film 170 and the substrate 100 may separate or detach when the substrate 100 is bent. Therefore, occurrence of the separation or detachment may be effectively prevented by allowing the protective film 170 to include the opening 170op corresponding (e.g., aligning) to the bending area BA as illustrated in FIG. 10. Further, the area of the opening 1700P of the protective film 1700 may be greater than the area of the bending area BA.

In an exemplary embodiment of the present inventive concept, the protective film 170 may not cover the edge of the substrate 100. For example, the protective film 170 may be disposed in the second region 2A.

In the exemplary embodiment of the present inventive concept, as illustrated in FIG. 10, the planarization layer 140 may include an opening outside the display area DA. The opening outside the display area DA may allow a portion of the display area DA that corresponds to the planarization layer 140 to be physically separated from a portion of the second region 2A that corresponds to the planarization layer 140. This separation may prevent impurities, etc. from penetrating from the outside from reaching the inside of the display area DA via the inside of the planarization layer 140. In addition, the OCA 510 and the polarization plate 520 may cover, for example, the opening of the planarization layer 140 as illustrated in FIG. 10.

In addition, referring to FIG. 10, the slope of the lateral wall of the outer contact hole OC is less steep (e.g., a smaller incline) than the slope of the lateral wall of the first inner contact hole C1 and/or the second inner contact hole C2. Therefore, a probability of corrosion occurring on or in the outer conductive layer 215b and the outer lower conductive layer 213b that may occur in the non-encapsulation area NEA may be reduced by reducing a probability of crack occurring on or in the outer conductive layer 215b.

Figure 11:
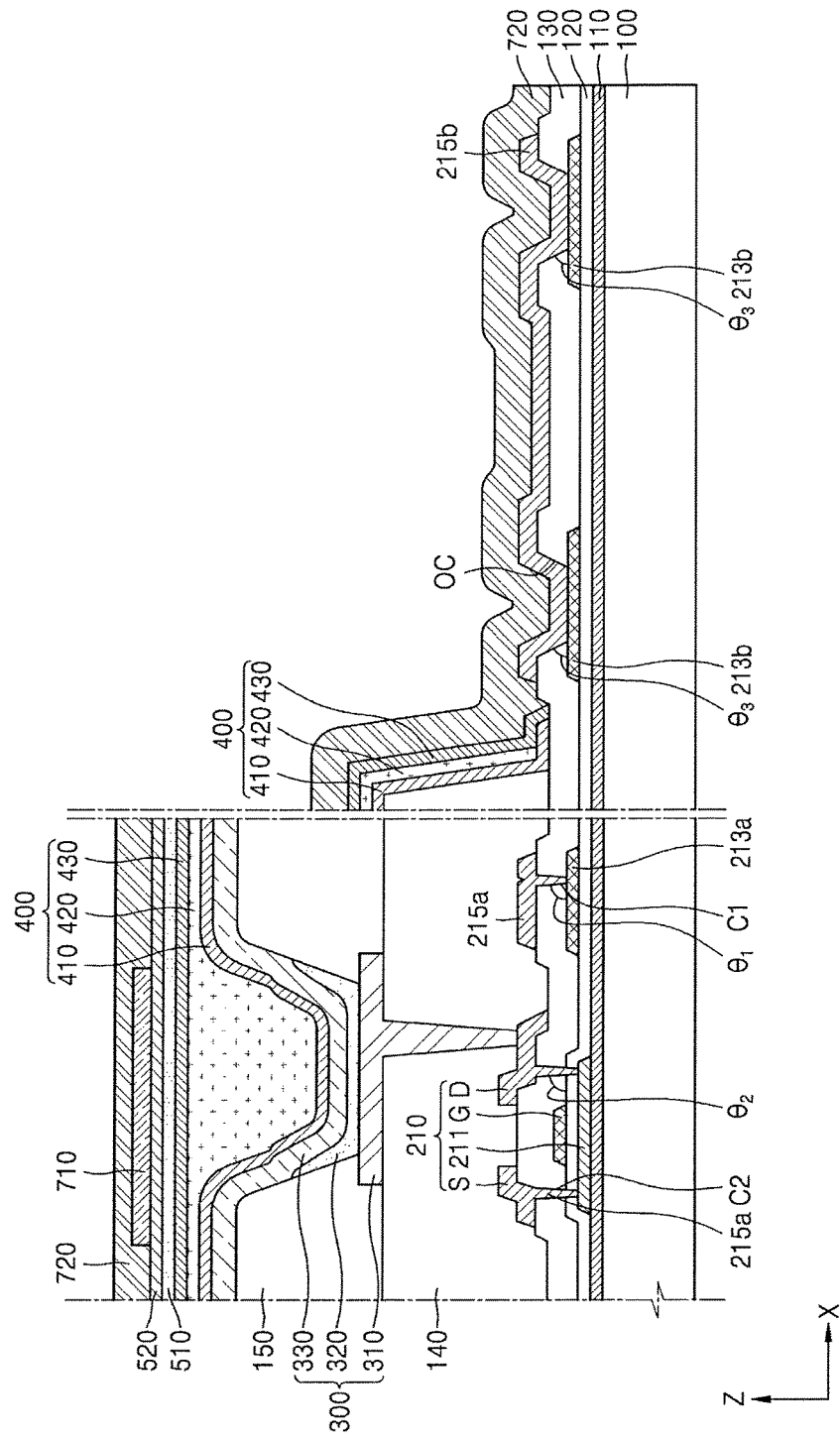
FIG. 11 is a cross-sectional view of a portion of a display device according to an exemplary embodiment of the present inventive concept.

FIG. 11 is a cross-sectional view of a portion of a display device according to an exemplary embodiment of the present inventive concept. Referring to FIG. 11, a touchscreen function may include a touch electrode 710 of various patterns which may be disposed over the encapsulation layer 400. When forming the touch electrode 710, the outer conductive layer 215b may be simultaneously formed and may include substantially the same material as that of the touch electrode 710. In addition, when forming a touch protective layer 720 disposed over (e.g., covering) the touch electrode 710 to protect the touch electrode 710, a protective layer covering the outer conductive layer 215b, etc. may be simultaneously formed. Further, the touch protective layer 720 may integrally extend from the display area DA up to at least the bending area BA when forming the touch protective layer 720. A structure simultaneously forming the outer conductive layer 215b when forming the touch electrode 710 as described above is applicable to the above-described display devices. In an exemplary embodiment of the present inventive concept, when forming the opposite electrode 330, the outer conductive layer 215b may be simultaneously formed and may include substantially the same material as that of the opposite electrode 330.

In addition, when forming an organic layer included in the display area DA, the organic layer 160 may be simultaneously formed and may include substantially the same material. For example, when forming the planarization layer 140 by using an organic material, the organic layer 160 may be simultaneously formed and may include substantially the same material as that of the planarization layer 140. For another example, when forming the pixel-defining layer 150, the organic layer 160 may be simultaneously formed and may include substantially the same material as that of the pixel defining layer 150. In another example, when forming the organic encapsulation layer 420 of the encapsulation layer 400, the organic layer 160 may be simultaneously formed and may include substantially the same material as that of the organic encapsulation layer 420.

Also, in the case where the interlayer insulating layer 130 includes an insulating organic material, when forming the interlayer insulating layer 130, the organic layer 160 may be simultaneously formed and may include substantially the same material, and various modifications may be made. The organic layer 160 may be formed by using a separate process regardless of the planarization layer 140 when needed.

A structure of simultaneously forming the organic layer 160 by using substantially the same material as that of the organic layer included in the display area DA is applicable to display devices described above or described below.

In this case, when forming the touch electrode 710, the outer conductive layer 215b may be simultaneously formed and may include substantially the same material. In this case, the outer conductive layer 215b may be disposed over the touch protective layer 720. For example, the outer conductive layer 215b may be covering the touch protective layer 720. Further, in addition to the touch protective layer 720, another organic insulating layer may be used for the touchscreen function. For example, in addition to the touch electrode 710, an additional touch electrode may be used and an organic insulating layer may be disposed between the touch electrode 710 and the additional touch electrode. In this case, the organic insulating layer may extend and be disposed over (e.g., cover) the outer conductive layer 215b, or a layer including the substantially same material as that of the organic insulating layer and simultaneously formed with the organic insulating layer may be disposed over (e.g., cover) the outer conductive layer 215b.

In addition, when forming the source electrode S or the drain electrode D, the outer conductive layer 215b may be simultaneously formed and may include substantially the same material as the source electrode S or the drain electrode D, and various modifications may be made. Also, in this case, the planarization layer 140 or another insulating layer may be disposed on (e.g., cover) the outer conductive layer 215b.

In addition, referring to FIG. 11, the slope of the lateral wall of the outer contact hole OC is less steep (e.g., a smaller incline) than the slopes of the lateral walls of the first and second inner contact holes C1 and C2. Therefore, a probability of corrosion occurring on or in of the outer conductive layer 215b and the outer lower conductive layer 213b that may occur in the non-encapsulation area NEA may be reduced by reducing a probability of a crack occurring on or in the outer conductive layer 215b.

Though the present inventive concept has been described with reference to the exemplary embodiments of the present inventive concept illustrated in the drawings, this is merely exemplary and it will be understood by those of ordinary skill in the art that various changes in form and detail and equivalents thereof may be made therein without departing from the spirit and scope of the inventive concept as defined by the following claims.

What is claimed is:
1. A display device comprising:
   a substrate divided into an encapsulation area and a non-encapsulation area;
   are interlayer insulating layer disposed over the substrate;
   an inner conductive layer disposed on the interlayer insulating layer in the encapsulation area;
   an outer conductive layer disposed on the interlayer insulating layer in the non-encapsulation area;
   an inner lower conductive layer disposed below the interlayer insulating layer in the encapsulation area;
   an outer lower conductive layer disposed below the interlayer insulating layer in the non-encapsulation area; and
   a first inner contact hole passing through the interlayer insulating layer and connecting the inner conductive layer to the inner lower conductive layer;
   a first outer contact hole passing through the interlayer insulating layer and connecting the outer conductive layer to the outer lower conductive layer,
   wherein a slope angle formed by a lateral wall of the first outer contact hole with respect to an upper surface of the substrate is less than a slope angle formed by a lateral wall of the first inner contact hole with respect to the upper surface of the substrate;
   a semiconductor layer disposed over the substrate;
   a gate insulating layer disposed between the semiconductor layer and the interlayer insulating layer; and
   a second inner contact hole passing through the interlayer insulating layer and the gate insulating layer and connecting the inner conductive layer to the semiconductor layer,
   the slope angle formed by the lateral wall of the outer contact hole with respect to the upper surface of the substrate being less than a slope angle formed by a lateral wall of the second inner contact hole with respect to the upper surface of the substrate.
2. The display device of claim 1, wherein the slope angle formed by the lateral wall of the first inner contact hole with respect to the upper surface of the substrate is substantially the same as the slope angle formed by the lateral wall of the second inner contact hole with respect to the upper surface of the substrate.

3. The display device of claim 1, wherein an area of the first outer contact hole is greater than an area of the first inner contact hole.

4. The display device of claim 1, wherein the slope angle formed by the lateral wall of the first outer contact hole with respect to the upper surface of the substrate ranges from about 10° to about 60°.

5. The display device of claim 1, wherein the outer conductive layer comprises substantially the same material as that of the inner conductive layer.

6. The display device of claim 1, further comprising a second outer contact hole adjacent to the first outer contact hole and in the non-encapsulation area, wherein the second outer contact hole passes through the interlayer insulating layer and connects the conductive layer to the outer lower conductive layer.

7. The display device of claim 1, further comprising:
an inorganic insulating layer comprising an opening or a groove in the non-encapsulation area; and
an organic layer filling at least a portion of the opening or the groove,
wherein the substrate comprises a bending area located between a first region and a second region and is bent around a bending axis extending in a first direction, and the opening or the groove overlaps the bending area.

8. The display device of claim 7, wherein the outer conductive layer extends from the first region to the second region by way of the bending area and is disposed on the organic layer.

9. The display device of claim 7, wherein the opening or the groove has an area greater than an area of the bending area.

10. The display device of claim 7, wherein the opening or the groove has an area greater than the area of the first outer contact hole.

11. The display device of claim 7, wherein the organic layer covers an inner lateral surface of the opening or the groove.

12. The display device of claim 7, wherein a height from the upper surface of the substrate to at least a portion of the organic layer is greater than a height from the upper surface of the substrate to the inorganic insulating layer.

13. The display device of claim 7, wherein the organic layer comprises an irregular surface in at least a portion of an upper surface thereof.

14. The display device of claim 7, further comprising a stress neutralization layer disposed over the outer conductive layer in the bending area.

15. The display device of claim 7, further comprising a protective film disposed on a surface of the substrate opposite to another surface of the substrate on which the inorganic insulating layer is disposed and comprising an opening corresponding to the bending area.

16. The display device of claim 1, wherein the encapsulation area includes an encapsulation layer comprising a first inorganic encapsulation layer, a second inorganic encapsulation layer, and an organic encapsulation layer disposed between the first and second inorganic encapsulation layers.

17. The display device of claim 1, wherein the encapsulation area includes an encapsulation substrate facing the substrate and a sealing member surrounding a display area of the display device, and the substrate and the encapsulation substrate are attached to one another by the sealing member.

18. The display device of claim 1, further comprising a touch electrode for a touchscreen located over the encapsulation area, wherein the touch electrode comprises a material substantially the same as that of the outer conductive layer.

19. The display device of claim 18, further comprising a touch protective layer covering the touch electrode and the outer conductive layer.

20. The display device of claim 1, further comprising a thin film transistor disposed in a display area of the display device and comprising a source electrode, a drain electrode, and a gate electrode,
wherein the outer conductive layer and the inner conductive layer being disposed on a same layer as a layer in which the source electrode and the drain electrode are disposed, and the outer lower conductive layer and the inner lower conductive layer being disposed on a same layer as a layer in which the gate electrode is disposed.

21. A display device comprising:
a substrate divided into an encapsulation area and a non-encapsulation area;
an interlayer insulating layer disposed over the substrate;
an inner conductive layer disposed on the interlayer insulating in the encapsulation area;
an outer conductive layer disposed on the interlayer insulating layer in the non-encapsulation area;
an inner lower conductive layer disposed below the interlayer insulating layer in the encapsulation area;
an outer lower conductive layer disposed below the interlayer insulating layer in the non-encapsulation area;
a first inner contact hole passing through the interlayer insulating layer and connecting the inner conductive layer to the inner lower conductive layer; and
an outer contact hole passing through the interlayer insulating layer and connecting the outer conductive layer to the outer lower conductive layer,
wherein a slope angle formed by a lateral wall of the outer contact hole with respect to an upper surface of the substrate is less than a slop angle formed by a lateral wall of the first inner contact hole with respect to the upper surface of the substrate, wherein an organic light-emitting diode is disposed in a display area of the display device and comprises a pixel electrode, an opposite electrode facing the pixel electrode, and an intermediate layer comprising an organic emission layer disposed between the pixel electrode and the opposite electrode.

22. A mask pattern to form the display device of claim 1 comprising:
an inner contact hole mask pattern for forming the first inner contact hole of the display device; and
an outer contact hole pattern for forming the first outer contact hole of the display device, having a shape different from a shape of an inner contact hole pattern.

23. The mask pattern of claim 22, wherein the outer contact hole pattern further comprises a central portion, a circumferential portion surrounding the central portion, and a spaced portion disposed between the central portion and the circumferential portion, and the central portion and the circumferential portion have same properties with respect to light, and the central portion and the spaced portion have opposite properties with respect to light.

24. The mask pattern of claim 23, wherein the circumferential portion has a shape substantially the same as a polygonal shape or a circular ring shape, and an irregular pattern is disposed along an outer parameter of the circumferential portion.

25. The mask pattern of claim 22, wherein the outer contact hole pattern comprises a central portion and a circumferential portion surrounding the central portion, wherein the circumferential portion comprising a semi-transmission portion.

26. The mask pattern of claim 22, wherein the outer contact argyle pattern has an area greater than an area of the inner contact hole pattern.

27. The mask pattern of claim 22, the display device further comprises an inorganic insulating layer comprising a groove in the non-encapsulation area, wherein the display device comprises a bending area bent around a bending axis, and the groove overlaps the bending area.

28. A display device comprising:
a flexible substrate divided into a first area, and a second area, wherein the second area includes a bending area;
an inorganic insulating layer disposed over the substrate, comprising:
    a buffer layer;
    a gate insulating layer;
    an interlayer insulating layer; and
    a groove in the second area, wherein the groove overlaps the bending area;
an inner conductive layer disposed in the first area;
an inner lower conductive layer disposed in the first area;
an outer conductive layer disposed in the second area;
an outer lower conductive layer disposed below the outer conductive layer in the second area;
an inner contact hole passing through the interlayer insulating layer and connecting the inner conductive layer to the inner lower conductive layer; and
at least one outer contact hole passing through the interlayer insulating layer and connecting the outer conductive layer to the outer lower conductive layer,
wherein an area of the at least one outer contact hole is greater than an area of the inner contact hole.

29. The display device of claim 28, further comprising:
a planarization layer disposed on the outer conductive layer and inner conductive layer and including an opening outside of the first area; and
a stress neutralization layer disposed on the planarization layer.

30. The display device of claim 28, wherein an angle of slope of a lateral wall of the at least one outer contact hole with respect to an upper surface of the substrate is less than an angle of slope of a lateral wall of the inner contact hole with respect to the upper surface of the substrate.

31. The display device of claim 28, wherein an outer contact hole is adjacent to a second outer contact hole and the distance between centers of adjacent outer contact holes is within a range of two times a width of the outer contact hole.

32. The display device of claim 28, further comprising a protective film overlapping the flexible substrate except the bending area.

* * * * *